United States Patent
Wang et al.

(10) Patent No.: US 10,816,901 B2
(45) Date of Patent: Oct. 27, 2020

(54) COATER WITH AUTOMATIC CLEANING FUNCTION AND COATER AUTOMATIC CLEANING METHOD

(71) Applicant: ACM Research (Shanghai) Inc., Shanghai (CN)

(72) Inventors: Hui Wang, Shanghai (CN); Fuping Chen, Shanghai (CN); Wenjun Wang, Shanghai (CN); Hongchao Yang, Shanghai (CN); Voha Nuch, Shanghai (CN); Fufa Chen, Shanghai (CN); Jian Wang, Shanghai (CN); Xiaoyan Zhang, Shanghai (CN); Shu Yang, Shanghai (CN)

(73) Assignee: ACM Research (Shanghai) Inc., Shanghai (CN)

( * ) Notice: Subject to any disclaimer, the term of this patent is extended or adjusted under 35 U.S.C. 154(b) by 494 days.

(21) Appl. No.: 15/511,547

(22) PCT Filed: Sep. 16, 2014

(86) PCT No.: PCT/CN2014/086644
§ 371 (c)(1),
(2) Date: Mar. 15, 2017

(87) PCT Pub. No.: WO2016/041151
PCT Pub. Date: Mar. 24, 2016

(65) Prior Publication Data
US 2017/0248848 A1    Aug. 31, 2017

(51) Int. Cl.
*G03F 7/16* (2006.01)
*H01L 21/67* (2006.01)
*H01L 21/687* (2006.01)

(52) U.S. Cl.
CPC .......... *G03F 7/162* (2013.01); *H01L 21/6715* (2013.01); *H01L 21/67086* (2013.01); *H01L 21/68742* (2013.01)

(58) Field of Classification Search
CPC .................. H01L 21/67005–67236; H01L 21/683–68792
See application file for complete search history.

(56) References Cited

U.S. PATENT DOCUMENTS 6,270,576 B1   8/2001  Araki et al.
6,723,168 B2   4/2004  Kao et al.
(Continued)

FOREIGN PATENT DOCUMENTS

CN   1818795 A    8/2006
CN   101528368 A  9/2009
(Continued)

OTHER PUBLICATIONS

Office Action issued in corresponding Chinese Application No. 201510242442.3 dated Oct. 15, 2018 (7 pages).
(Continued)

*Primary Examiner* — Spencer E Bell
(74) *Attorney, Agent, or Firm* — Osha Liang LLP

(57) ABSTRACT

A coater with automatic cleaning function and a coater automatic cleaning method. The coater (100,200,300,400, 500,600,700,800) includes a coater chamber (101,201,301, 401,501,601,701,801) capable of being filled up with cleaning solution, a substrate chuck (102,202,302,402,502,602, 702,802) holding and positioning a substrate (103,203,303, 403,503,603,703,803), and at least one shroud (108,208, 308,408,508) capable of moving up for preventing photoresist from splashing out of the coater chamber (101, 201,301,401,501,601,701,801), or moving down and immersing into the cleaning solution for cleaning. The coater (100,200,300,400,500,600,700,800) automatic clean-
(Continued)

ing method includes the following steps: turning off a liquid outlet valve (118,218,318,418A,418B,518,532,618,718, 818) of the coater (100,200,300,400,500,600,700,800); filling up a coater chamber (101,201,301,401,501,601,701, 801) with cleaning solution; after photoresist in the coater chamber (101,201,301,401,501,601,701,801) being dissolved into the cleaning solution, turning on the liquid outlet valve (118,218,318,418A,418B,518,532,618,718,818) and draining the cleaning solution out of the coater chamber (101,201,301,401,501,601,701,801).

11 Claims, 17 Drawing Sheets

(56) References Cited

U.S. PATENT DOCUMENTS

| | | | |
|---|---|---|---|
| 2002/0197400 | A1 | 12/2002 | Kao et al. |
| 2007/0012339 | A1 | 1/2007 | Fukuda et al. |
| 2008/0242105 | A1* | 10/2008 | Kai .................... C23C 16/46 438/758 |
| 2012/0318301 | A1* | 12/2012 | Higashijima ....... H01L 21/6719 134/26 |

FOREIGN PATENT DOCUMENTS

| | | |
|---|---|---|
| CN | 203764494 U | 8/2014 |
| JP | H0714811 A | 1/1995 |
| JP | 2002-143749 A | 5/2002 |

OTHER PUBLICATIONS

International Search Report issued in PCT/CN2014/086644 dated Jun. 15, 2015 (4 pages).
Written Opinion of the International Searching Authority issued in PCT/CN2014/086644 dated Jun. 15, 2015 (5 pages).
Office Action with Search Report issued in corresponding Chinese Application No. 201510242142.3 dated Jun. 11, 2019 (14 pages).
Office Action issued in corresponding Taiwanese Application No. 10721211490 dated Dec. 24, 2018, and English translation thereof (29 pages).

* cited by examiner

COATER WITH AUTOMATIC CLEANING FUNCTION AND COATER AUTOMATIC CLEANING METHOD

BACKGROUND OF THE INVENTION

1. Field of the Invention

The present invention generally relates to a semiconductor manufacturing apparatus, and more particularly relates to a coater with automatic cleaning function and a coater automatic cleaning method.

2. The Related Art

In manufacturing semiconductor devices, lithography is the process of transferring patterns on a mask to a surface of a wafer. The lithography process includes steps of coating photoresist, exposure and development. For coating photoresist onto the surface of the wafer, a coater is used. A conventional coater includes a chamber. A wafer chuck is positioned in the chamber for holding the wafer. The wafer chuck is connected to a driving mechanism which is used for driving the wafer chuck to rotate. The chamber defines an exhaust port through which gas in the chamber is vented out of the chamber.

For forming a photoresist layer on the surface of the wafer, the driving mechanism drives the wafer chuck to rotate. A nozzle is moved above the wafer and aims at the center of the wafer. The nozzle sprays photoresist toward the center of the wafer, and the photoresist spreads outward from the center of the wafer to the edge of the wafer until the entire surface of the wafer is covered with a layer of photoresist. Generally, in order to ensure the entire surface of the wafer is evenly coated with the photoresist, the rotation speed of the wafer chuck is increased at the end of the coating process. High-speed centrifugal whirling of the wafer is a standard method for applying photoresist coatings in semiconductor manufacturing. This technique, known as "Spin Coating," produces a thin uniform layer of photoresist on the surface of the wafer.

However, with the rotation speed of the wafer chuck increasing, the photoresist is spun off the wafer and flying to the inner surface of the chamber. The photoresist is gathered inside the chamber, which causes the wafer is contaminated and brings an adverse effect on the coating process result. Besides, the photoresist may adhere at the exhaust port of the chamber, which affects the gas exhaust. Therefore, the chamber needs to regularly clean. However, so far, it mainly relies on manually clean the chamber, and when cleaning the chamber, the coating process must be stopped. What's more, in the advanced packaging process, thick photoresist (about 10 um) is widely used. For forming a thick photoresist layer on the surface of the wafer, a lot of photoresist (about 100 um) is sprayed on the wafer, but large quantity of the photoresist is spun off the wafer and flying to the inner surface of the chamber. The photoresist is soon gathered inside the chamber, so the frequency of the chamber cleaning increases and the chamber needs to clean about every 12 hours. If adopting manual cleaning, it will be a time-consuming and laborious, lowing productivity and unable to meet demands of the high volume manufacturing.

SUMMARY

The present invention provides a coater with automatic cleaning function. According to an embodiment of the present invention, a coater with automatic cleaning function includes a coater chamber capable of being filled up with cleaning solution, a substrate chuck holding and positioning a substrate, and at least one shroud capable of moving up for preventing photoresist from splashing out of the coater chamber, or moving down and immersing into the cleaning solution for cleaning.

According to another embodiment of the present invention, a coater with automatic cleaning function includes a coater chamber capable of being filled up with cleaning solution, a substrate chuck holding and positioning a substrate, and a vertical actuator connecting with the substrate chuck for driving the substrate chuck to move up or move down.

The present invention provides a coater automatic cleaning method, comprising: turning off a liquid outlet valve of the coater; filling up a coater chamber with cleaning solution; after photoresist in the coater chamber being dissolved into the cleaning solution, turning on the liquid outlet valve and draining the cleaning solution out of the coater chamber.

BRIEF DESCRIPTION OF THE DRAWINGS

The present invention will be apparent to those skilled in the art by reading the following description of embodiments thereof, with reference to the attached drawings, in which.

DETAILED DESCRIPTION OF EMBODIMENTS

The present invention provides a coater with automatic cleaning function. The coater using for coating photoresist on a surface of a substrate has a coater chamber. The coater is capable of filling up the coater chamber with cleaning solution for dissolving the photoresist in the coater chamber and draining the cleaning solution out of the coater chamber after the photoresist being dissolved into the cleaning solution. Compared to a conventional coater, the coater of the present invention realizes automatic cleaning, saving time and effort, and improving productivity.

Figure 1A:
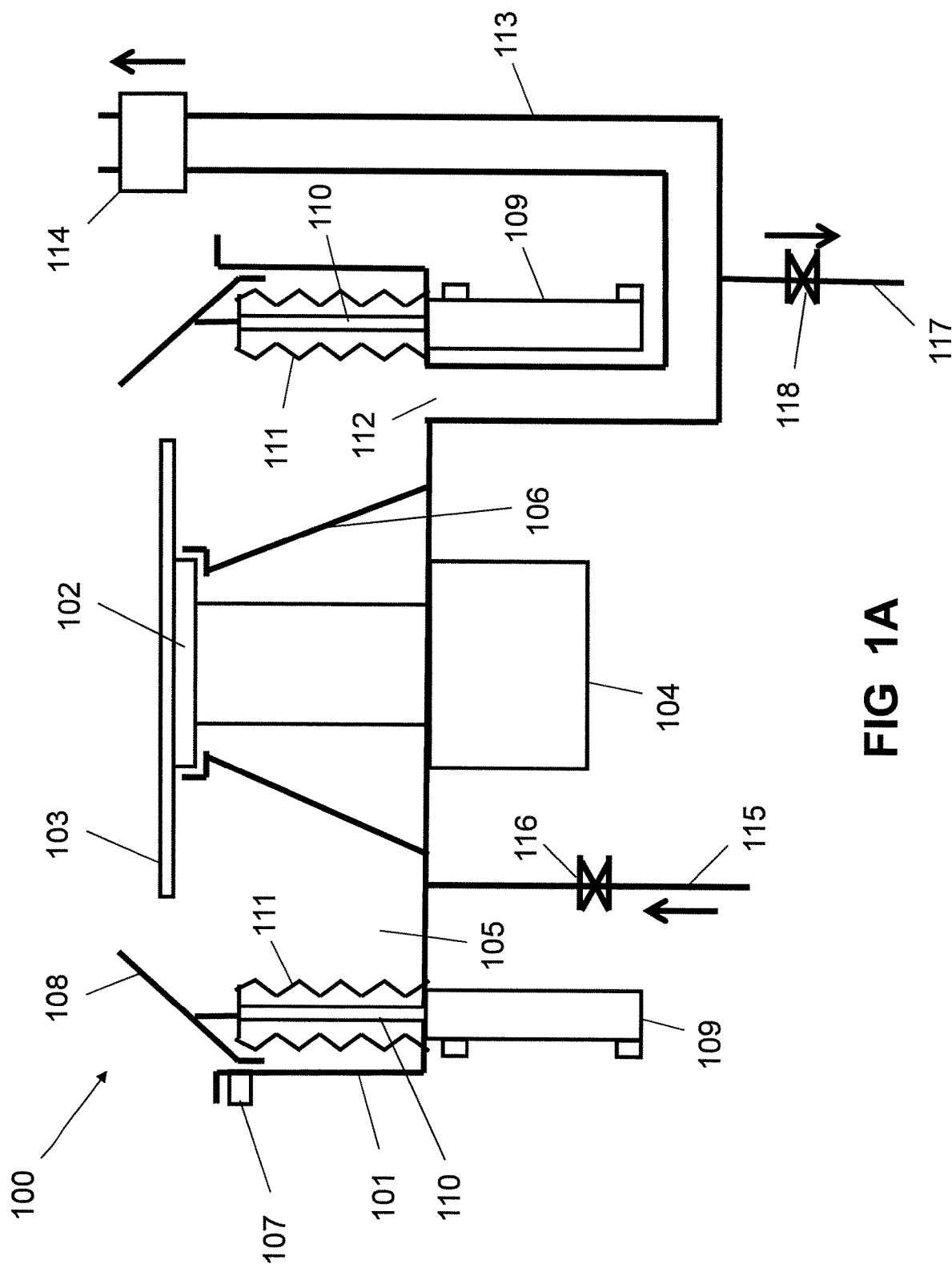
FIGS. 1A to 1B are cross-sectional views illustrating a coater with automatic cleaning function according to an exemplary embodiment of the present invention.
Figure 1B:
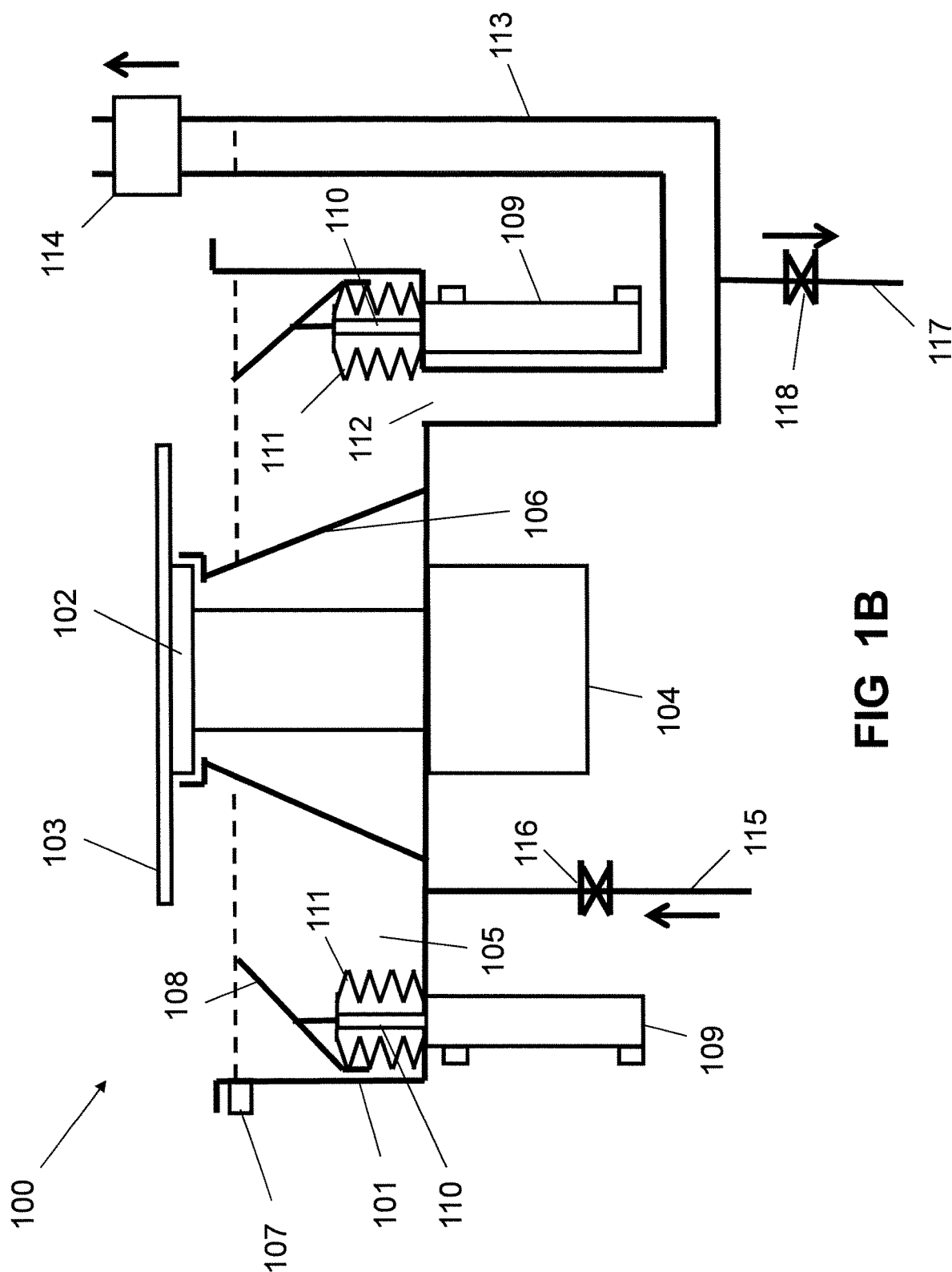

Referring to FIG. 1A to FIG. 1B, FIGS. 1A to 1B illustrate a coater with automatic cleaning function according to an exemplary embodiment of the present invention. The coater 100 includes a coater chamber 101. A substrate chuck 102 for holding and positioning a substrate 103 is located in the coater chamber 101. The substrate chuck 102 can be a vacuum chuck or a magnetic suspension chuck. The substrate chuck 102 is connected to a rotating actuator 104 used for driving the substrate chuck 102 to rotate. The coater chamber 101 has a solution trough 105 for being filled up with cleaning solution which can dissolve the photoresist. The solution trough 105 is formed between a side wall of the coater chamber 101 and a protecting wall 106 which is positioned in the coater chamber 101 for preventing the cleaning solution from entering into the rotating actuator 104. In this embodiment, the protecting wall 106 extends to approach the top surface of the substrate chuck 102 for protecting the substrate chuck 102 from being coated with the photoresist. A level sensor 107 is installed on the coater chamber 101 for detecting the level of the cleaning solution in the solution trough 105. At least one shroud 108 is capable of moving up for preventing the photoresist from splashing out of the coater chamber 101, or moving down and immersing into the cleaning solution for cleaning. For supporting the shroud 108, there are preferably at least two driving mechanisms 109 and every driving mechanism 109 connects with a supporting shaft 110 which is vertically disposed in the solution trough 105. The shroud 108 is fixed on top ends of the supporting shafts 110. The driving mechanisms 109 drive the supporting shafts 110 to move up or move down, which makes the shroud 108 move up for preventing the photoresist from splashing out of the coater chamber 101, or move down and immerse into the cleaning solution of the solution trough 105 for cleaning. The driving mechanism 109 can be a motor or a cylinder. The driving mechanisms 109 can drive the supporting shafts 110 to vibrate at high speed when the shroud 108 is immersed into the cleaning solution for cleaning, which is conducive to stripping the photoresist from the shroud 108. Every supporting shaft 110 is sealed into a bellows 111 which is made of a material that can resist corrosion of the cleaning solution, such as polytetrafluoroethylene. The coater chamber 101 defines an exhaust port 112 for venting gas out of the coater chamber 101. In this embodiment, the exhaust port 112 connects to the solution trough 105. An exhaust pipe 113 is connected to the exhaust port 112. A switch valve 114 is installed on the exhaust pipe 113. When coating the photoresist on the surface of the substrate 103, the switch valve 114 is turned on for venting gas out of the coater chamber 101, and when the coater needs to clean, the switch valve 114 is turned off for filling up the solution trough 105 with the cleaning solution. In this case, the exhaust pipe 113 is also filled with the cleaning solution. A liquid inlet pipe 115 is connected to the solution trough 105 for supplying the cleaning solution to the solution trough 105, and a liquid inlet valve 116 is installed on the liquid inlet pipe 115. A liquid outlet pipe 117 is connected to the solution trough 105 for draining the cleaning solution out of the solution trough 105. In this embodiment, because the exhaust pipe 113 is filled with the cleaning solution, for fully draining the cleaning solution, preferably, the liquid outlet pipe 117 is positioned at the lowest point of the exhaust pipe 113. A liquid outlet valve 118 is installed on the liquid outlet pipe 117.

As shown in FIG. 1A, when the coater 100 is used for coating the photoresist on the surface of the substrate 103, the switch valve 114 is turned on so that the gas in the coater chamber 101 is vented out of the coater chamber 101 through the exhaust port 112 and the exhaust pipe 113. The driving mechanisms 109 drive the supporting shafts 110 to move up, making the shroud 108 move up for preventing the photoresist from splashing out of the coater chamber 101. The rotating actuator 104 drives the substrate chuck 102 to rotate and then the photoresist is sprayed to the surface of the substrate 103. Through a method of spin coating, a uniform layer of photoresist is coated on the surface of the substrate 103. During the coating process, the photoresist is mainly gathered on the shroud 108.

As shown in FIG. 1B, when the coater 100 needs to clean, the switch valve 114 and the liquid outlet valve 118 are turned off. The liquid inlet valve 116 is turned on and the cleaning solution is supplied to the solution trough 105 through the liquid inlet pipe 115. The solution trough 105 is filled up with the cleaning solution. The height of the liquid level in the solution trough 105 is lower than the height of the substrate chuck 102. The driving mechanisms 109 drive the supporting shafts 110 to move down, making the shroud 108 move down and immerse into the cleaning solution of the solution trough 105 for cleaning. The driving mechanisms 109 drive the supporting shafts 110 to vibrate at high speed when the shroud 108 is immersed into the cleaning solution. After the photoresist in the coater chamber 101 and on the shroud 108 is dissolved into the cleaning solution, the liquid outlet valve 118 is turned on and the cleaning solution in the solution trough 105 and the exhaust pipe 113 is drained out through the liquid outlet pipe 117.

Figure 2A:
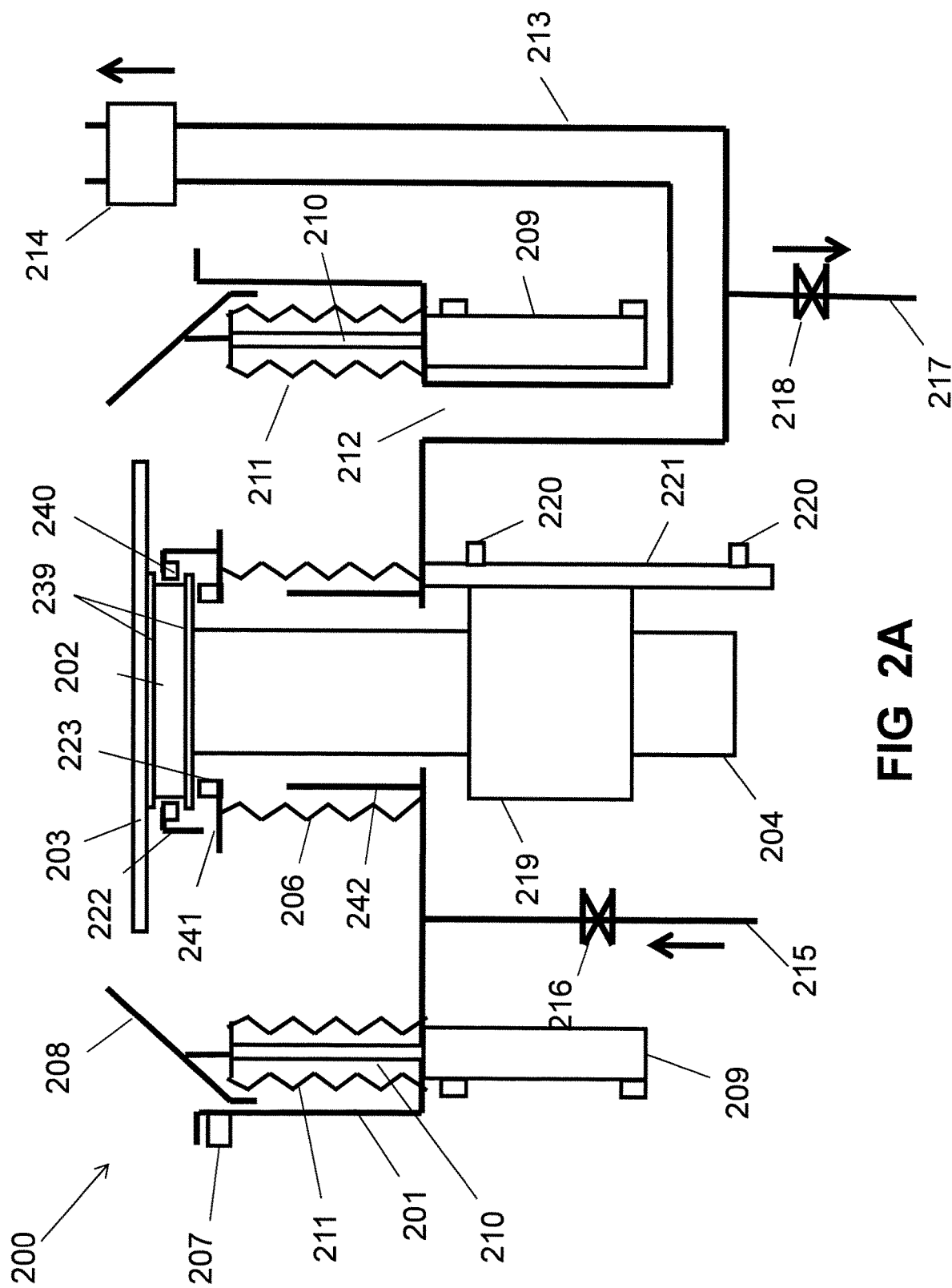
FIGS. 2A to 2C are cross-sectional views illustrating a coater with automatic cleaning function according to another exemplary embodiment of the present invention.
Figure 2B:
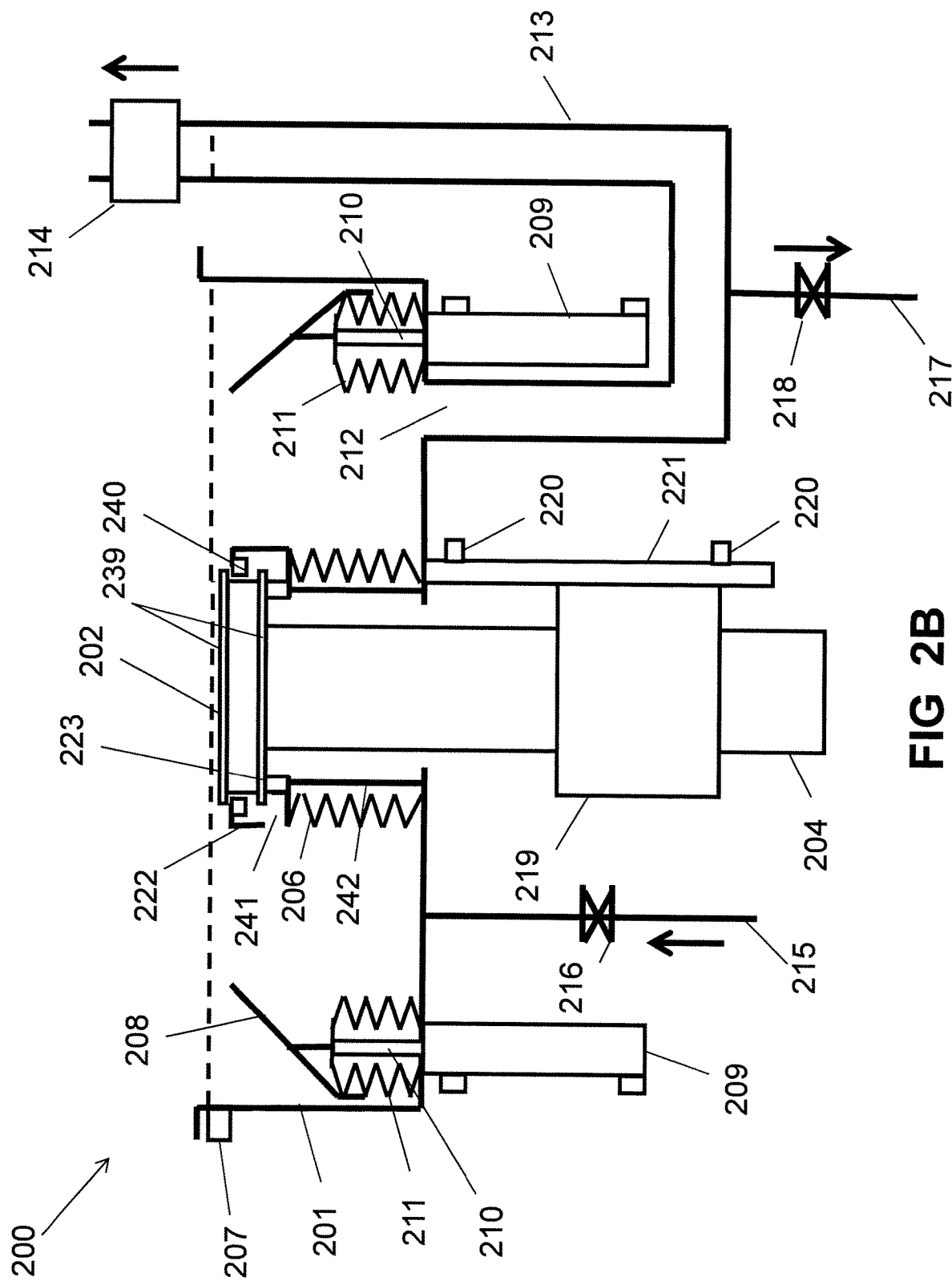
Figure 2C:
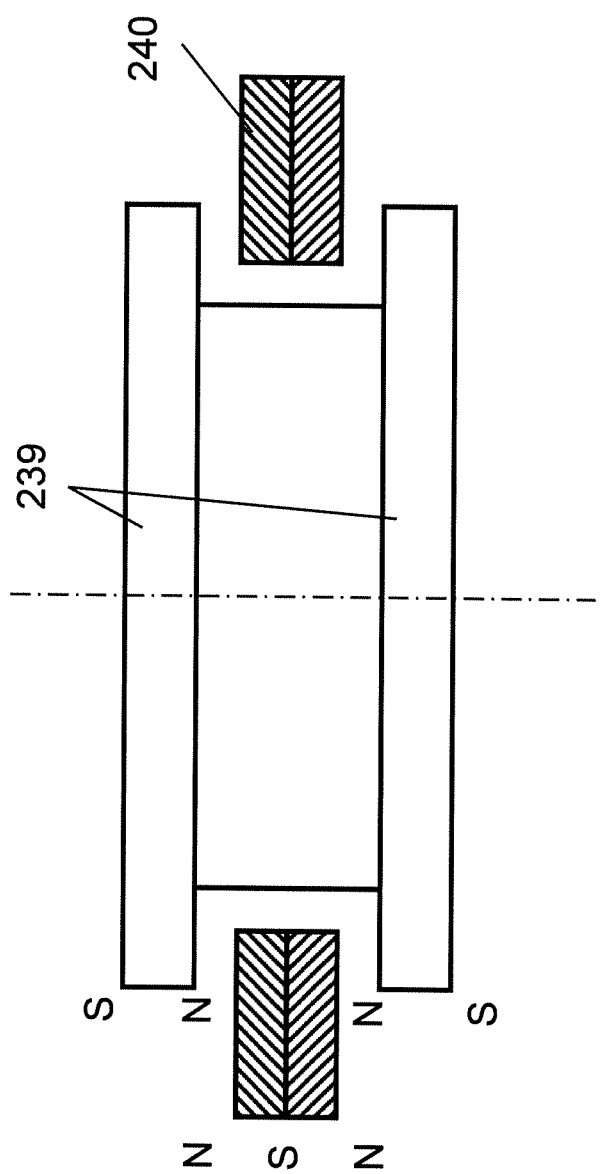

Referring to FIGS. 2A to 2C, FIGS. 2A to 2C are cross-sectional views illustrating a coater with automatic cleaning function according to another exemplary embodiment of the present invention. The coater 200 includes a coater chamber 201. A substrate chuck 202 for holding and positioning a substrate 203 is located in the coater chamber 201. Two magnets 239 are respectively positioned at the top surface of the substrate chuck 202 and the bottom surface of the substrate chuck 202. The polarity of the two magnets' surfaces which are opposite is the same, as shown in FIG. 2C. The substrate chuck 202 is connected to a rotating actuator 204 used for driving the substrate chuck 202 to rotate and a vertical actuator 219 used for driving the substrate chuck 202 to move up or move down. There are two position sensors 220 disposed on a shaft 221 which is vertically fixed at the outer bottom of the coater chamber 201, and one position sensor 220 is located at the top of the shaft 221 and the other position sensor 220 is located at the bottom of the shaft 221. The vertical actuator 219 moves along the shaft 221. For coating photoresist, the vertical actuator 219 moves up along the shaft 221 and stops at a position of the position sensor 220 located at the top of the shaft 221. For coater cleaning, the vertical actuator 219 moves down along the shaft 221 and stops at a position of the other position sensor 220 located at the bottom of the shaft 221. An elastic protecting wall 206 is positioned in the coater chamber 201. The elastic protecting wall 206 can be a bellows. For preventing the cleaning solution from entering into the rotating actuator 204 and the vertical actuator 219, one end of the elastic protecting wall 206 is connected with the inner bottom of the coater chamber 201 and the other end of the elastic protecting wall 206 is connected with a sealing member 222. The sealing member 222 has a sealing ring 223 settled on the bottom of the sealing member 222 and a magnet body 240 settled at the top of the sealing member 222. The magnet body 240 is located between the two magnets 239. The polarity of the both sides of the magnet body 240 is the same as the polarity of the two magnets' surfaces which are opposite, as shown in FIG. 2C. A drain opening 241 is defined at the bottom of the sealing member 222. A bearing wall 242 is positioned in the coater chamber 201 and is surrounded by the elastic protecting wall 206. A level sensor 207 is installed on the coater chamber 201 for detecting the level of the cleaning solution in the coater chamber 201. At least one shroud 208 is capable of moving up for preventing the photoresist from splashing out of the coater chamber 201, or moving down and immersing into the cleaning solution for cleaning. For supporting the shroud 208, there are preferably at least two driving mechanisms 209 and every driving mechanism 209 connects with a supporting shaft 210 which is vertically disposed in the coater chamber 201. The shroud 208 is fixed on top ends of the supporting shafts 210. The driving mechanisms 209 drive the supporting shafts 210 to move up or move down, which makes the shroud 208 move up for preventing the photoresist from splashing out of the coater chamber 201, or move down and immerse into the cleaning solution of the coater chamber 201 for cleaning. The driving mechanism 209 can be a motor or a cylinder. The driving mechanisms 209 drive the supporting shafts 210 to vibrate at high speed when the shroud 208 is immersed into the cleaning solution for cleaning, which is conducive to stripping the photoresist from the shroud 208. Every supporting shaft 210 is sealed into a bellows 211 which is made of a material that can resist corrosion of the cleaning solution. The coater chamber 201 defines an exhaust port 212 for venting gas out of the coater chamber 201. An exhaust pipe 213 is connected to the exhaust port 212. A switch valve 214 is installed on the exhaust pipe 213. When coating the photoresist on the surface of the substrate 203, the switch valve 214 is turned on for venting gas out of the coater chamber 201, and when the coater needs to clean, the switch valve 214 is turned off for filling up the coater chamber 201 with the cleaning solution. In this case, the exhaust pipe 213 is also filled with the cleaning solution. A liquid inlet pipe 215 is connected to the coater chamber 201 for supplying the cleaning solution to the coater chamber 201, and a liquid inlet valve 216 is installed on the liquid inlet pipe 215. A liquid outlet pipe 217 is connected to the coater chamber 201 for draining the cleaning solution out of the coater chamber 201. In this embodiment, because the exhaust pipe 213 is filled with the cleaning solution, for fully draining the cleaning solution, preferably, the liquid outlet pipe 217 is positioned at the lowest point of the exhaust pipe 213. A liquid outlet valve 218 is installed on the liquid outlet pipe 217.

As shown in FIG. 2A, when the coater 200 is used for coating the photoresist on the surface of the substrate 203, the switch valve 214 is turned on so that the gas in the coater chamber 201 is vented out of the coater chamber 201 through the exhaust port 212 and the exhaust pipe 213. The driving mechanisms 209 drive the supporting shafts 210 to move up, making the shroud 208 move up for preventing the photoresist from splashing out of the coater chamber 201. The vertical actuator 219 drives the substrate chuck 202 to move up until the position sensor 220 located at the top of the shaft 221 detects the vertical actuator 219. In the process of the substrate chuck 202 moving up, the magnet body 240 abuts on the magnet 239 positioned at the bottom surface of the substrate chuck 202, making the sealing member 222 move up along with the substrate chuck 202. When the substrate chuck 202 moves up to the process position, the substrate chuck 202 stops moving up and the magnet body 240 is located between the two magnets 239 and does not contact with the two magnets 239 under the action of magnetic force between the magnet body 240 and the two magnets 239. The substrate chuck 202 either does not contact with the sealing ring 223. The rotating actuator 204 drives the substrate chuck 202 to rotate and then the photoresist is sprayed to the surface of the substrate 203. Through a method of spin coating, a uniform layer of photoresist is coated on the surface of the substrate 203.

As shown in FIG. 2B, when the coater 200 needs to clean, the switch valve 214 and the liquid outlet valve 218 are turned off. The vertical actuator 219 drives the substrate chuck 202 to move down until the position sensor 220 located at the bottom of the shaft 221 detects the vertical actuator 219. The elastic protecting wall 206 is compressed downward and the bearing wall 242 holds up the sealing member 222. The bottom of the substrate chuck 202 is pressed against the sealing ring 223 for preventing the cleaning solution from entering into the vertical actuator 219 and the rotating actuator 204. The liquid inlet valve 216 is turned on and the cleaning solution is supplied to the coater chamber 201 through the liquid inlet pipe 215. The coater chamber 201 is filled up with the cleaning solution. The substrate chuck 202, the sealing member 222 and the elastic protecting wall 206 are immersed into the cleaning solution for cleaning. The driving mechanisms 209 drive the supporting shafts 210 to move down, making the shroud 208 move down and immerse into the cleaning solution of the coater chamber 201 for cleaning. The driving mechanisms 209 drive the supporting shafts 210 to vibrate at high speed when the shroud 208 is immersed into the cleaning solution. After the photoresist in the coater chamber 201 and on the shroud 208 is dissolved into the cleaning solution, the liquid outlet valve 218 is turned on and the cleaning solution in the coater chamber 201 and the exhaust pipe 213 is drained out through the liquid outlet pipe 217. The cleaning solution in the sealing member 222 is drained from the drain opening 241.

Figure 3A:
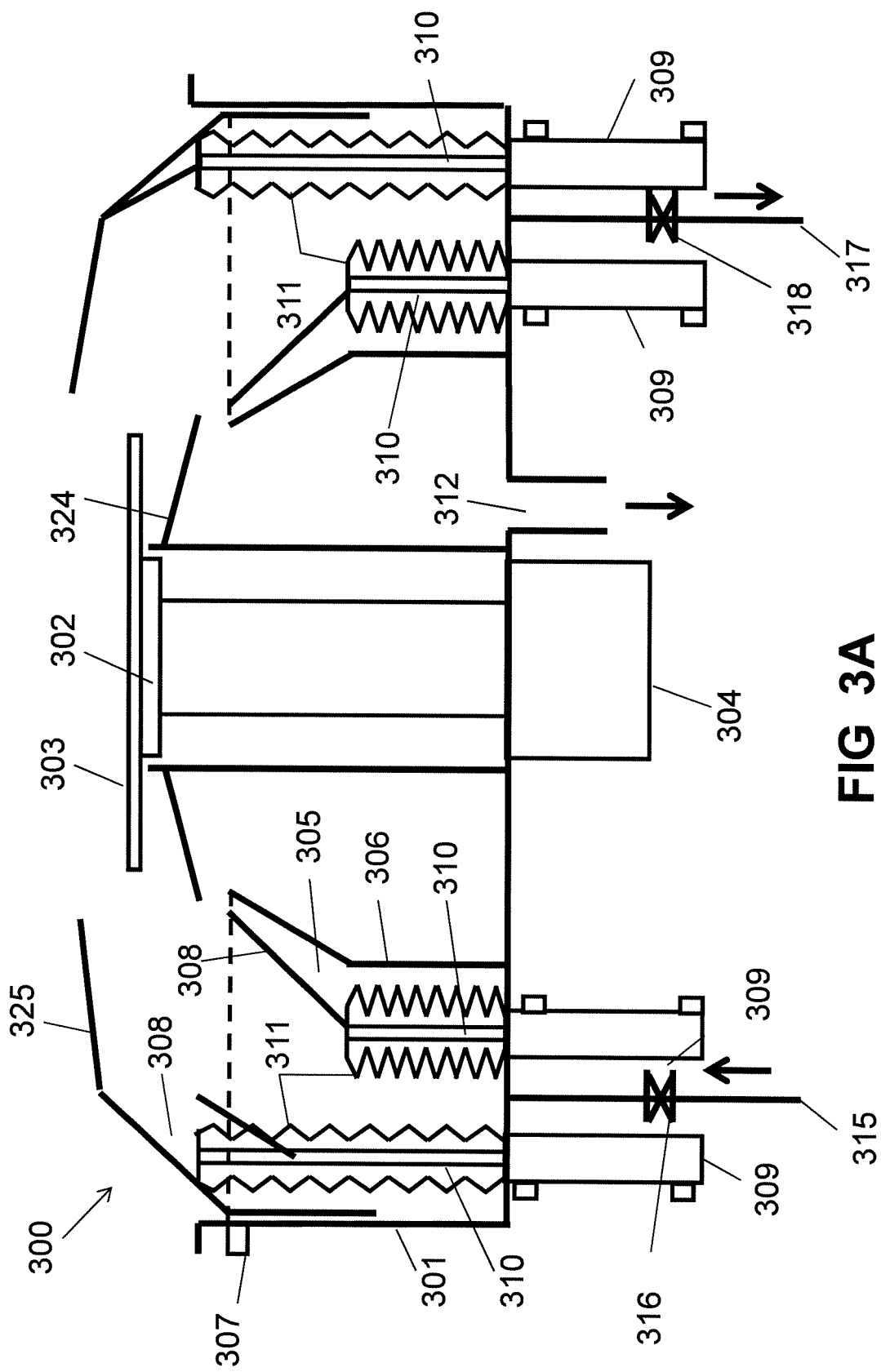
FIGS. 3A to 3C are cross-sectional views illustrating a coater with automatic cleaning function according to another exemplary embodiment of the present invention.
Figure 3B:
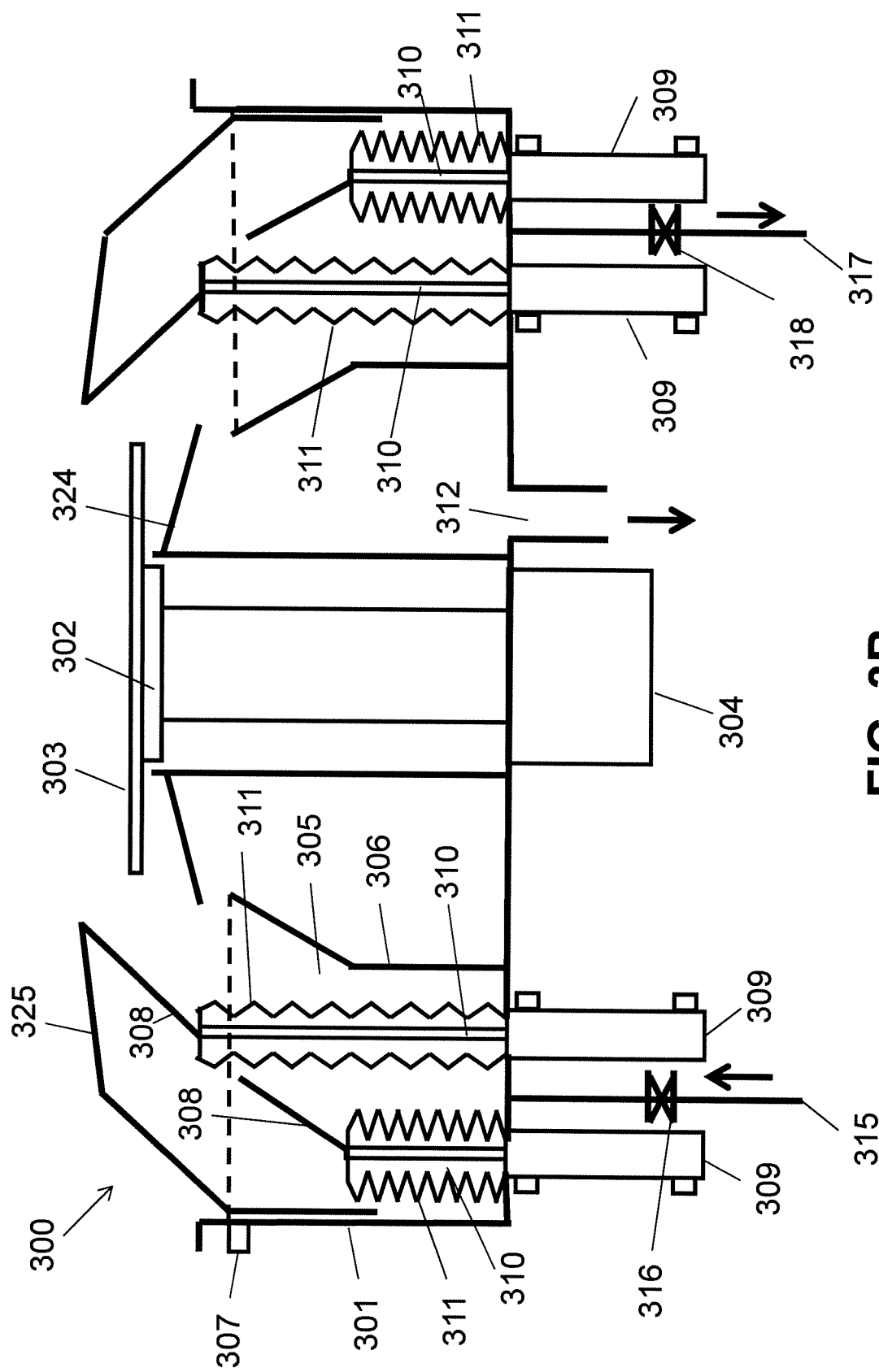
Figure 3C:
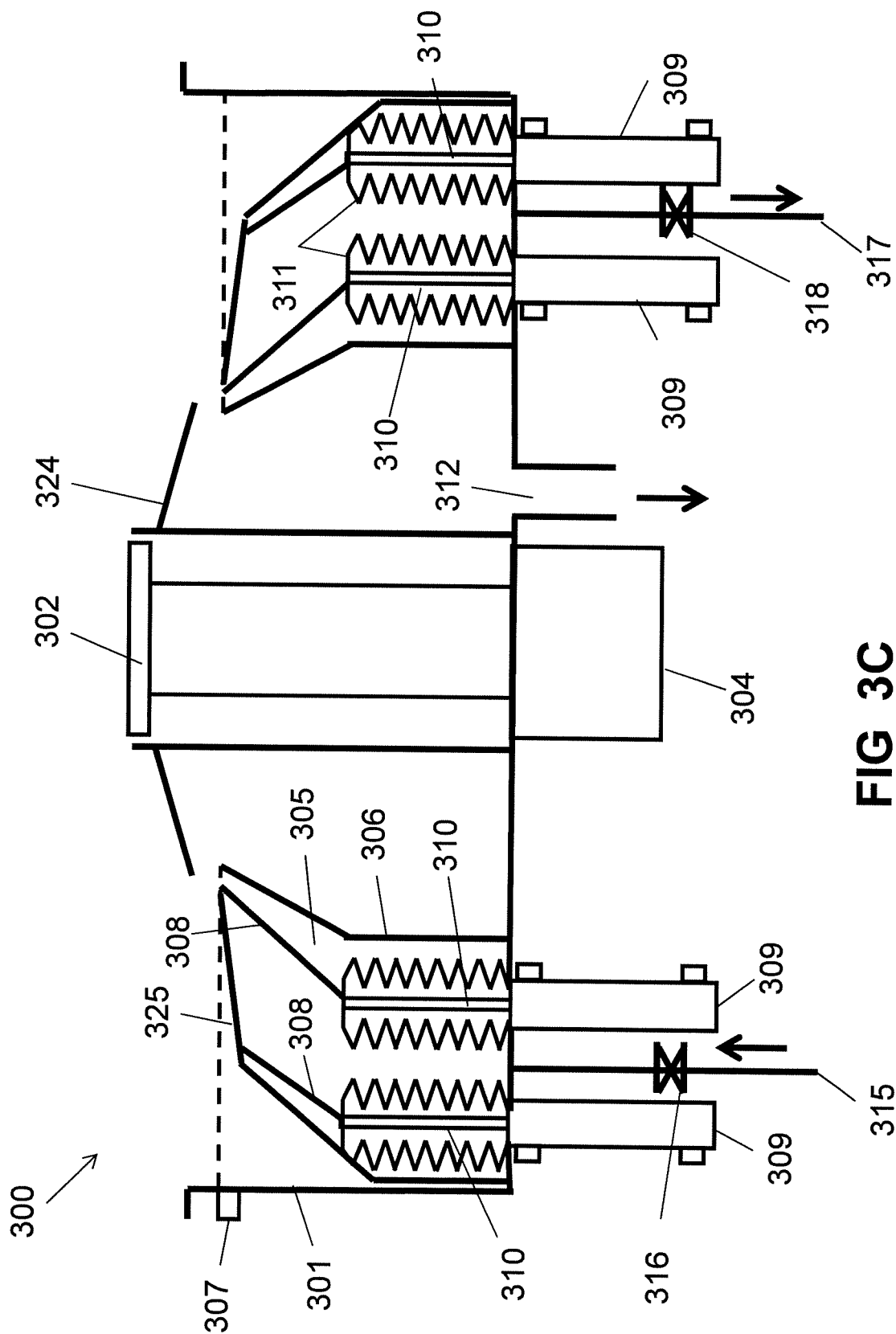

Referring to FIGS. 3A to 3C, FIGS. 3A to 3C are cross-sectional views illustrating a coater with automatic cleaning function according to another exemplary embodiment of the present invention. The coater 300 includes a coater chamber 301. A substrate chuck 302 for holding and positioning a substrate 303 is located in the coater chamber 301. The substrate chuck 302 can be a vacuum chuck or a magnetic suspension chuck. The substrate chuck 302 is connected to a rotating actuator 304 used for driving the substrate chuck 302 to rotate. The coater chamber 301 has a solution trough 305 for being filled up with cleaning solution which can dissolve the photoresist. The solution trough 305 is formed between a side wall of the coater chamber 301 and a protecting wall 306 which is positioned in the coater chamber 301 for preventing the cleaning solution from entering into the rotating actuator 304. A shielding plate 324 is supported around the substrate chuck 302 for protecting the substrate chuck 302 from being coated with the photoresist. A level sensor 307 is installed on the coater chamber 301 for detecting the level of the cleaning solution in the solution trough 305. Two shrouds 308 are capable of moving up for preventing the photoresist from splashing out of the coater chamber 301, or moving down and immersing into the cleaning solution for cleaning. For supporting every shroud 308, there are preferably at least two driving mechanisms 309 and every driving mechanism 309 connects with a supporting shaft 310 which is vertically disposed in the solution trough 305. The shrouds 308 are fixed on top ends of the supporting shafts 310. The driving mechanisms 309 drive the supporting shafts 310 to move up or move down, which makes the shrouds 308 move up for preventing the photoresist from splashing out of the coater chamber 301, or move down and immerse into the cleaning solution of the solution trough 305 for cleaning. The driving mechanism 309 can be a motor or a cylinder. The driving mechanisms 309 drive the supporting shafts 310 to vibrate at high speed when the shrouds 308 are immersed into the cleaning solution for cleaning, which is conducive to stripping the photoresist from the shrouds 308. Every supporting shaft 310 is sealed into a bellows 311 which is made of a material that can resist corrosion of the cleaning solution. The coater chamber 301 defines an exhaust port 312 for venting gas out of the coater chamber 301. A liquid inlet pipe 315 is connected to the solution trough 305 for supplying the cleaning solution to the solution trough 305, and a liquid inlet valve 316 is installed on the liquid inlet pipe 315. A liquid outlet pipe 317 is connected to the solution trough 305 for draining the cleaning solution out of the solution trough 305. A liquid outlet valve 318 is installed on the liquid outlet pipe 317. A chamber cover 325 is supported by the shrouds 308.

As shown in FIG. 3A and FIG. 3B, when the coater 300 is used for coating the photoresist on the surface of the substrate 303, the liquid outlet valve 318 is turned off. The liquid inlet valve 316 is turned on and the cleaning solution is supplied to the solution trough 305 through the liquid inlet pipe 315. The solution trough 305 is filled up with the cleaning solution. The driving mechanisms 309 drive the supporting shafts 310 to move up, making one of the shrouds 308 move up for preventing the photoresist from splashing out of the coater chamber 301. The shroud 308 which moves up for preventing the photoresist from splashing out of the coater chamber 301 supports the chamber cover 325 above the coater chamber 301 for maintaining the similar air flow pattern, ensuring the coating uniformity on the edge of the substrate 303. The other shroud 308 is immersed into the cleaning solution. The rotating actuator 304 drives the substrate chuck 302 to rotate and then the photoresist is sprayed to the surface of the substrate 303. Through a method of spin coating, a uniform layer of photoresist is coated on the surface of the substrate 303. After a period of time which can be pre-set in a controller, the other shroud 308 which is immersed into the cleaning solution is driven to move up for preventing the photoresist from splashing out of the coater chamber 301 and supporting the chamber cover 325 above the coater chamber 301. The former shroud 308 is driven to move down and immerse into the cleaning solution for cleaning. The driving mechanisms 309 drive the supporting shafts 310 to vibrate at high speed when the shroud 308 is immersed into the cleaning solution for cleaning. Because the photoresist is mainly gathered on the shrouds 308 during the coating process, the two shrouds 308 alternatively move up or move down, and the coating process can continue with no need for stop, which improves productivity.

As shown in FIG. 3C, after the coating process is completed, the two shrouds 308 can simultaneously be driven to move down and immerse into the cleaning solution for cleaning. The chamber cover 325 moves down and immerses into the cleaning solution along with the two shrouds 308. After the photoresist is completely dissolved into the cleaning solution, the liquid outlet valve 318 is turned on and the cleaning solution in the solution trough 305 is drained out through the liquid outlet pipe 317.

Figure 4:
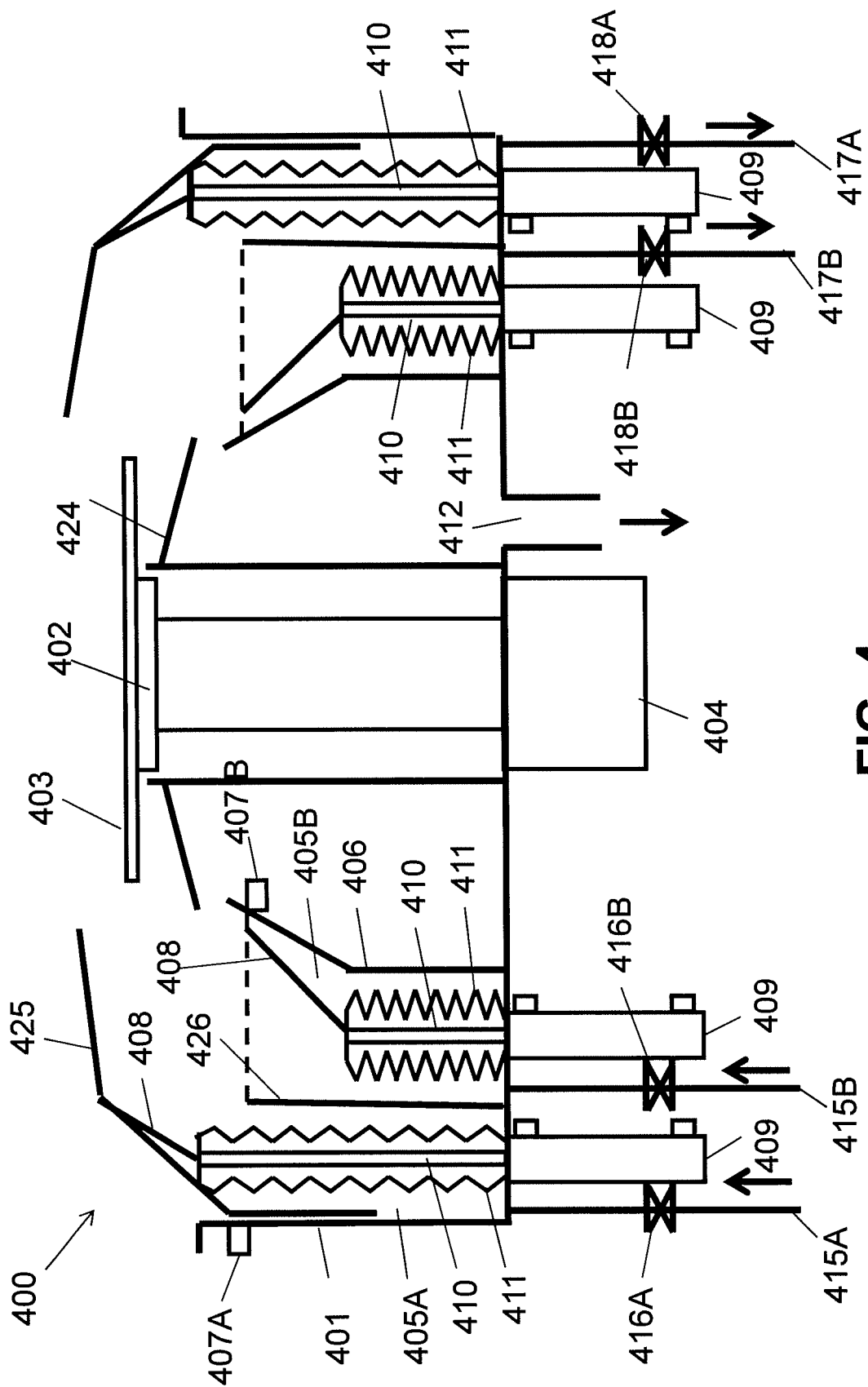
FIG. 4 is a cross-sectional view illustrating a coater with automatic cleaning function according to another exemplary embodiment of the present invention.

Referring to FIG. 4, FIG. 4 is a cross-sectional view illustrating a coater with automatic cleaning function according to another exemplary embodiment of the present invention. The coater 400 includes a coater chamber 401. A substrate chuck 402 for holding and positioning a substrate 403 is located in the coater chamber 401. The substrate chuck 402 can be a vacuum chuck or a magnetic suspension chuck. The substrate chuck 402 is connected to a rotating actuator 404 used for driving the substrate chuck 402 to rotate. Compared to the coater 300, a solution trough formed between a side wall of the coater chamber 401 and a protecting wall 406 which is positioned in the coater chamber 401 for preventing the cleaning solution from entering into the rotating actuator 404 is divided into two individual solution troughs by a partition wall 426. So the coater chamber 401 has a first solution trough 405A and a second solution trough 405B for being filled up with cleaning solution which can dissolve the photoresist. A shielding plate 424 is supported around the substrate chuck 402 for protecting the substrate chuck 402 from being coated with the photoresist. A first level sensor 407A is installed on the coater chamber 401 for detecting the level of the cleaning solution in the first solution trough 405A. A second level sensor 407B is installed on the protecting wall 406 for detecting the level of the cleaning solution in the second solution trough 405B. Two shrouds 408 are capable of moving up for preventing the photoresist from splashing out of the coater chamber 401, or moving down and immersing into the cleaning solution for cleaning. The first solution trough 405A and the second solution trough 405B respectively receive one of the shrouds 408. For supporting every shroud 408, there are preferably at least two driving mechanisms 409 and every driving mechanism 409 connects with a supporting shaft 410. The shrouds 408 are fixed on top ends of the supporting shafts 410. The driving mechanisms 409 drive the supporting shafts 410 to move up or move down, which makes the shrouds 408 move up for preventing the photoresist from splashing out of the coater chamber 401, or move down and immerse into the cleaning solution of corresponding solution trough for cleaning. The driving mechanism 409 can be a motor or a cylinder. The driving mechanisms 409 drive the supporting shafts 410 to vibrate at high speed when the shrouds 408 are immersed into the cleaning solution for cleaning, which is conducive to stripping the photoresist from the shrouds 408. Every supporting shaft 410 is sealed into a bellows 411 which is made of a material that can resist corrosion of the cleaning solution. The coater chamber 401 defines an exhaust port 412 for venting gas out of the coater chamber 401. A first liquid inlet pipe 415A is connected to the first solution trough 405A for supplying the cleaning solution to the first solution trough 405A, and a first liquid inlet valve 416A is installed on the first liquid inlet pipe 415A. A first liquid outlet pipe 417A is connected to the first solution trough 405A for draining the cleaning solution out of the first solution trough 405A. A first liquid outlet valve 418A is installed on the first liquid outlet pipe 417A. A second liquid inlet pipe 415B is connected to the second solution trough 405B for supplying the cleaning solution to the second solution trough 405B, and a second liquid inlet valve 416B is installed on the second liquid inlet pipe 415B. A second liquid outlet pipe 417B is connected to the second solution trough 405B for draining the cleaning solution out of the second solution trough 405B. A second liquid outlet valve 418B is installed on the second liquid outlet pipe 417B. A chamber cover 425 is supported by the shrouds 408.

When the coater 400 is used for coating the photoresist on the surface of the substrate 403, the shroud 408 corresponding to the first solution trough 405A is driven to move up for preventing the photoresist from splashing out of the coater chamber 401. The shroud 408 supports the chamber cover 425 above the coater chamber 401 for maintaining the similar air flow pattern, ensuring the coating uniformity on the edge of the substrate 403. The first solution trough 405A has no cleaning solution. The second liquid outlet valve 418B is turned off. The second liquid inlet valve 416B is turned on and the cleaning solution is supplied to the second solution trough 405B through the second liquid inlet pipe 415B. The second solution trough 405B is filled up with the cleaning solution. The other shroud 408 corresponding to the second solution trough 405B is driven to move down and immerse into the cleaning solution of the second solution trough 405B. After a period of time which can be pre-set in a controller, the second liquid outlet valve 418B is turned on and the cleaning solution in the second solution trough 405B is drained through the second liquid outlet pipe 417B. The shroud 408 corresponding to the second solution trough 405B is driven to move up and support the chamber cover 425 above the coater chamber 401. The first liquid outlet valve 418A is turned off. The first liquid inlet valve 416A is turned on and the cleaning solution is supplied to the first solution trough 405A through the first liquid inlet pipe 415A. The first solution trough 405A is filled up with the cleaning solution. The shroud 408 corresponding to the first solution trough 405A is driven to move down and immerse into the cleaning solution of the first solution trough 405A for cleaning. The two shrouds 408 alternatively move up or move down.

Figure 5A:
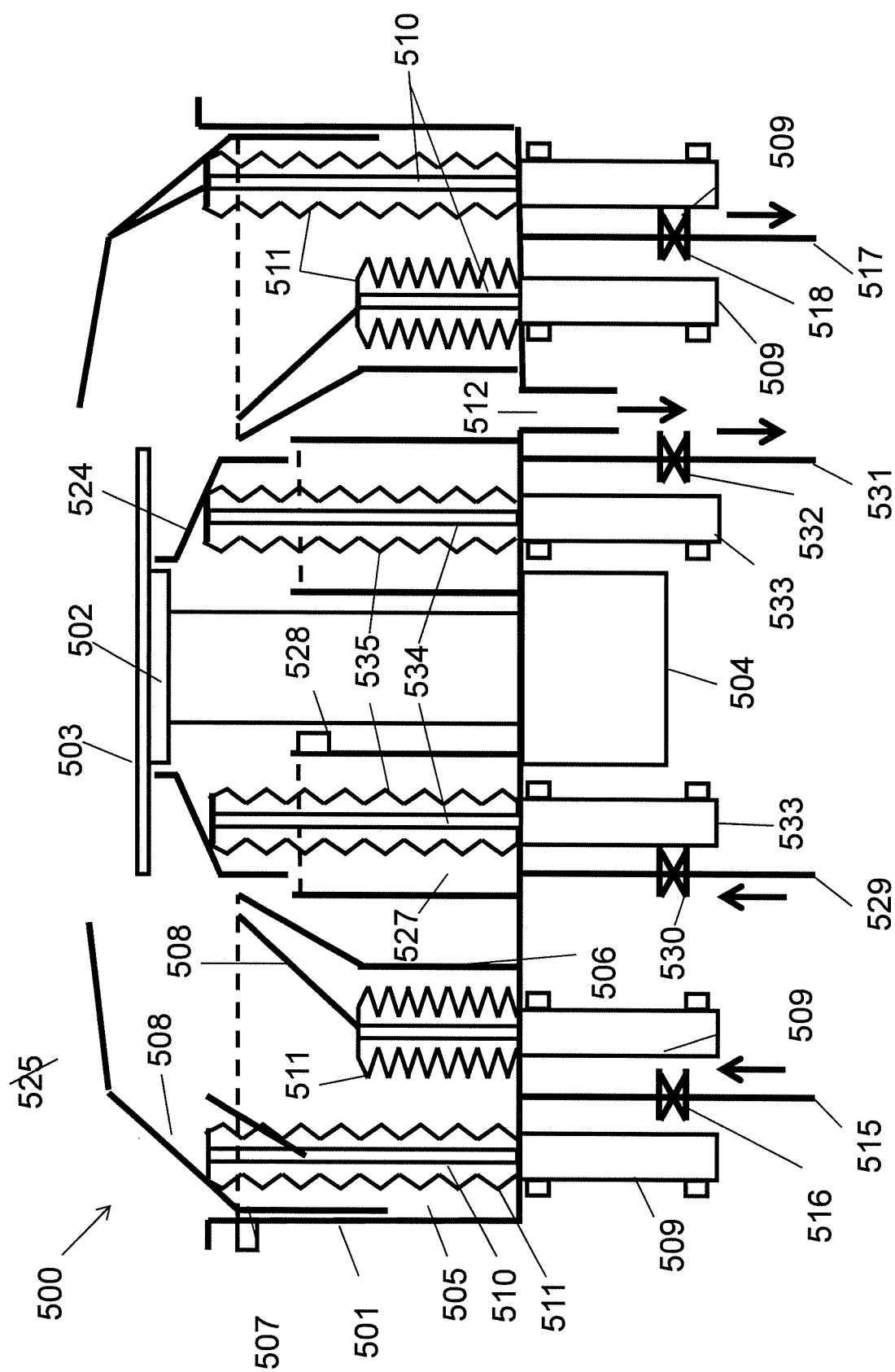
FIGS. 5A to 5B are cross-sectional views illustrating a coater with automatic cleaning function according to another exemplary embodiment of the present invention.
Figure 5B:
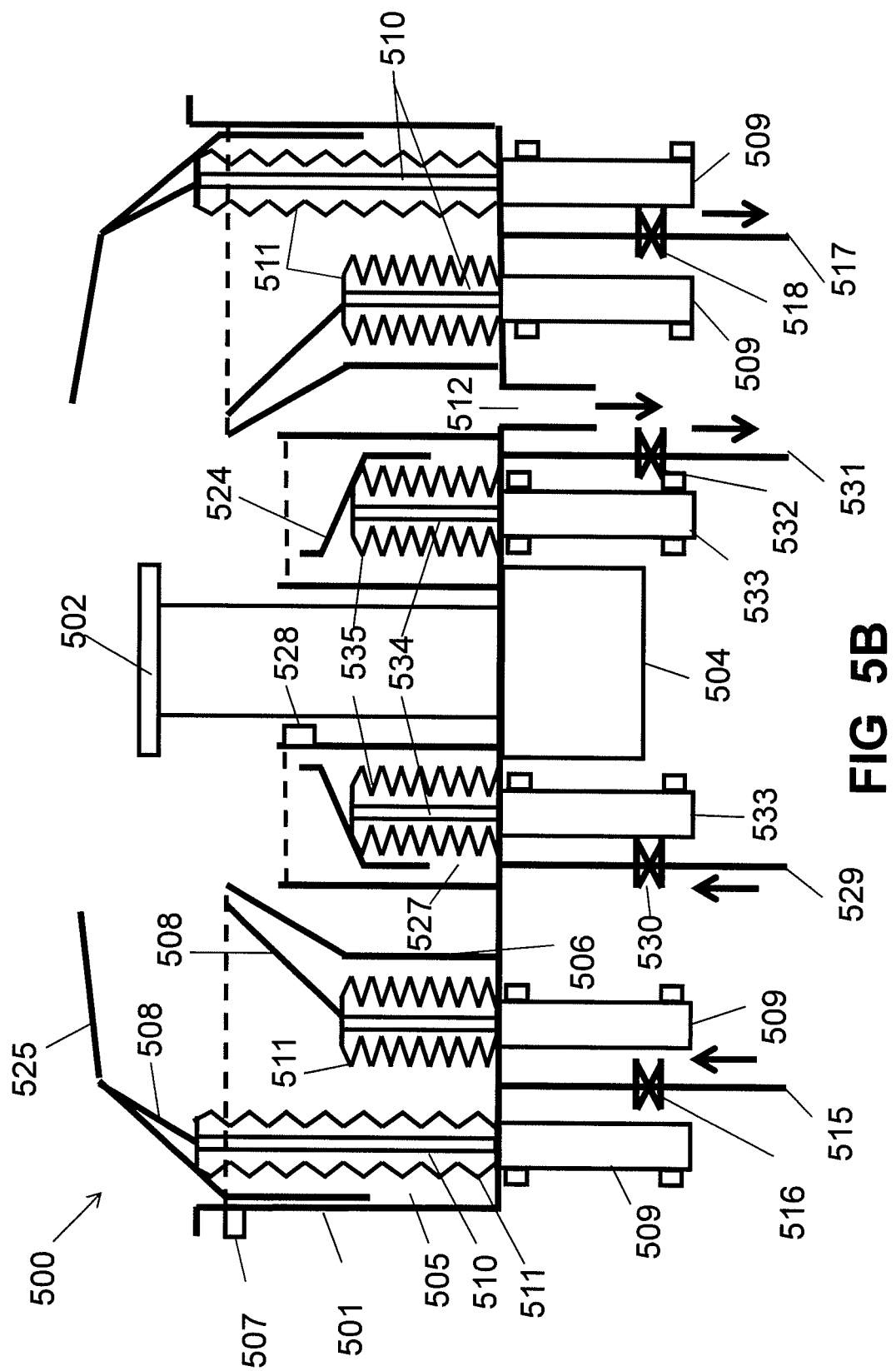

Referring to FIGS. 5A to 5B, FIGS. 5A to 5B are cross-sectional views illustrating a coater with automatic cleaning function according to another exemplary embodiment of the present invention. The coater 500 includes a coater chamber 501. A substrate chuck 502 for holding and positioning a substrate 503 is located in the coater chamber 501. The substrate chuck 502 can be a vacuum chuck or a magnetic suspension chuck. The substrate chuck 502 is connected to a rotating actuator 504 used for driving the substrate chuck 502 to rotate. The coater chamber 501 has a solution trough 505 for being filled up with cleaning solution which can dissolve the photoresist. The solution trough 505 is formed between a side wall of the coater chamber 501 and a protecting wall 506 which is positioned in the coater chamber 501. A shielding plate 524 is supported around the substrate chuck 502 for protecting the substrate chuck 502 from being coated with the photoresist. A level sensor 507 is installed on the coater chamber 501 for detecting the level of the cleaning solution in the solution trough 505. Two shrouds 508 are capable of moving up for preventing the photoresist from splashing out of the coater chamber 501, or moving down and immersing into the cleaning solution of the solution trough 505 for cleaning. For supporting every shroud 508, there are preferably at least two driving mechanisms 509 and every driving mechanism 509 connects with a supporting shaft 510 which is vertically disposed in the solution trough 505. The shrouds 508 are fixed on top ends of the supporting shafts 510. The driving mechanisms 509 drive the supporting shafts 510 to move up or move down, which makes the shrouds 508 move up for preventing the photoresist from splashing out of the coater chamber 501, or move down and immerse into the cleaning solution of the solution trough 505 for cleaning. The driving mechanism 509 can be a motor or a cylinder. The driving mechanisms 509 drive the supporting shafts 510 to vibrate at high speed when the shrouds 508 are immersed into the cleaning solution for cleaning, which is conducive to stripping the photoresist from the shrouds 508. Every supporting shaft 510 is sealed into a bellows 511 which is made of a material that can resist corrosion of the cleaning solution. The coater chamber 501 defines an exhaust port 512 for venting gas out of the coater chamber 501. A liquid inlet pipe 515 is connected to the solution trough 505 for supplying the cleaning solution to the solution trough 505, and a liquid inlet valve 516 is installed on the liquid inlet pipe 515. A liquid outlet pipe 517 is connected to the solution trough 505 for draining the cleaning solution out of the solution trough 505. A liquid outlet valve 518 is installed on the liquid outlet pipe 517. A chamber cover 525 is supported by the shrouds 508. For cleaning the shielding plate 524, the coater chamber 501 has another solution trough 527 for being filled up with cleaning solution which can dissolve the photoresist. Another level sensor 528 is used for detecting the level of the cleaning solution in the solution trough 527. Another liquid inlet pipe 529 is connected to the solution trough 527 for supplying the cleaning solution to the solution trough 527, and another liquid inlet valve 530 is installed on the liquid inlet pipe 529. Another liquid outlet pipe 531 is connected to the solution trough 527 for draining the cleaning solution out of the solution trough 527. Another liquid outlet valve 532 is installed on the liquid outlet pipe 531. For supporting the shielding plate 524 around the substrate chuck 502, there are at least another two driving mechanisms 533 and every driving mechanism 533 connects with a supporting shaft 534 which is vertically disposed in the solution trough 527. The shielding plate 524 is fixed on top ends of the supporting shafts 534. The driving mechanisms 533 drive the supporting shafts 534 to move up or move down, which makes the shielding plate 524 move up, or move down and immerse into the cleaning solution of the solution trough 527 for cleaning. The driving mechanisms 533 drive the supporting shafts 534 to vibrate at high speed when the shielding plate 524 is immersed into the cleaning solution for cleaning, which is conducive to stripping the photoresist from the shielding plate 524.

Every supporting shaft 534 is sealed into a bellows 535 which is made of a material that can resist corrosion of the cleaning solution.

As shown in FIG. 5A, when the coater 500 is used for coating the photoresist on the surface of the substrate 503, the liquid outlet valve 518 is turned off. The liquid inlet valve 516 is turned on and the cleaning solution is supplied to the solution trough 505 through the liquid inlet pipe 515. The solution trough 505 is filled up with the cleaning solution. The driving mechanisms 509 drive the supporting shafts 510 to move up, making one of the shrouds 508 move up for preventing the photoresist from splashing out of the coater chamber 501. The shroud 508 which moves up for preventing the photoresist from splashing out of the coater chamber 501 supports the chamber cover 525 above the coater chamber 501 for maintaining the similar air flow pattern, ensuring the coating uniformity on the edge of the substrate 503. The other shroud 508 is immersed into the cleaning solution. The rotating actuator 504 drives the substrate chuck 502 to rotate and then the photoresist is sprayed to the surface of the substrate 503. Through a method of spin coating, a uniform layer of photoresist is coated on the surface of the substrate 503. After a period of time which can be pre-set in a controller, the other shroud 508 which is immersed into the cleaning solution is driven to move up for preventing the photoresist from splashing out of the coater chamber 501 and supporting the chamber cover 525 above the coater chamber 501. The former shroud 508 is driven to move down and immerse into the cleaning solution for cleaning. The driving mechanisms 509 drive the supporting shafts 510 to vibrate at high speed when the shroud 508 is immersed into the cleaning solution for cleaning. The two shrouds 508 alternatively move up or move down, and the shielding plate 524 surrounds the substrate chuck 502 all the time during the coating process.

As shown in FIG. 5B, after the coating process is completed, the liquid outlet valve 532 is turned off. The liquid inlet valve 530 is turned on and the cleaning solution is supplied to the solution trough 527 through the liquid inlet pipe 529. The solution trough 527 is filled up with the cleaning solution. The driving mechanisms 533 drive the supporting shafts 534 to move down, which makes the shielding plate 524 move down and immerse into the cleaning solution of the solution trough 527 for cleaning. The driving mechanisms 533 drive the supporting shafts 534 to vibrate at high speed when the shielding plate 524 is immersed into the cleaning solution for cleaning. The two shrouds 508 can simultaneously be driven to move down and immerse into the cleaning solution of the solution trough 505 for cleaning. The chamber cover 525 moves down and immerses into the cleaning solution of the solution trough 505 along with the two shrouds 508. After the photoresist is completely dissolved into the cleaning solution, the liquid outlet valve 518 and the liquid outlet valve 532 are turned on and the cleaning solution in the solution trough 505 and the cleaning solution in the solution trough 527 are drained out through the liquid outlet pipe 517 and liquid outlet pipe 531.

Figure 6A:
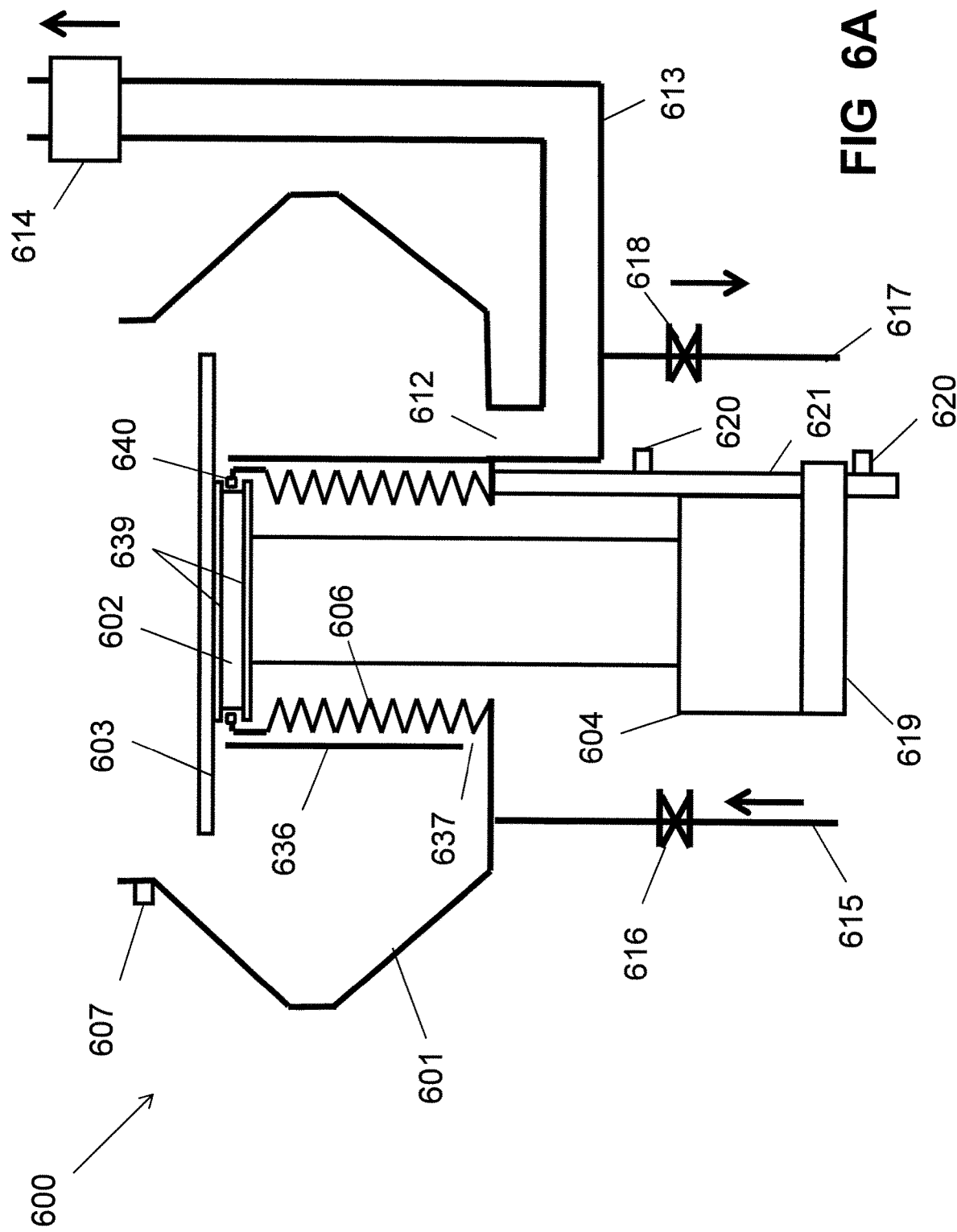
FIGS. 6A to 6B are cross-sectional views illustrating a coater with automatic cleaning function according to another exemplary embodiment of the present invention.
Figure 6B:
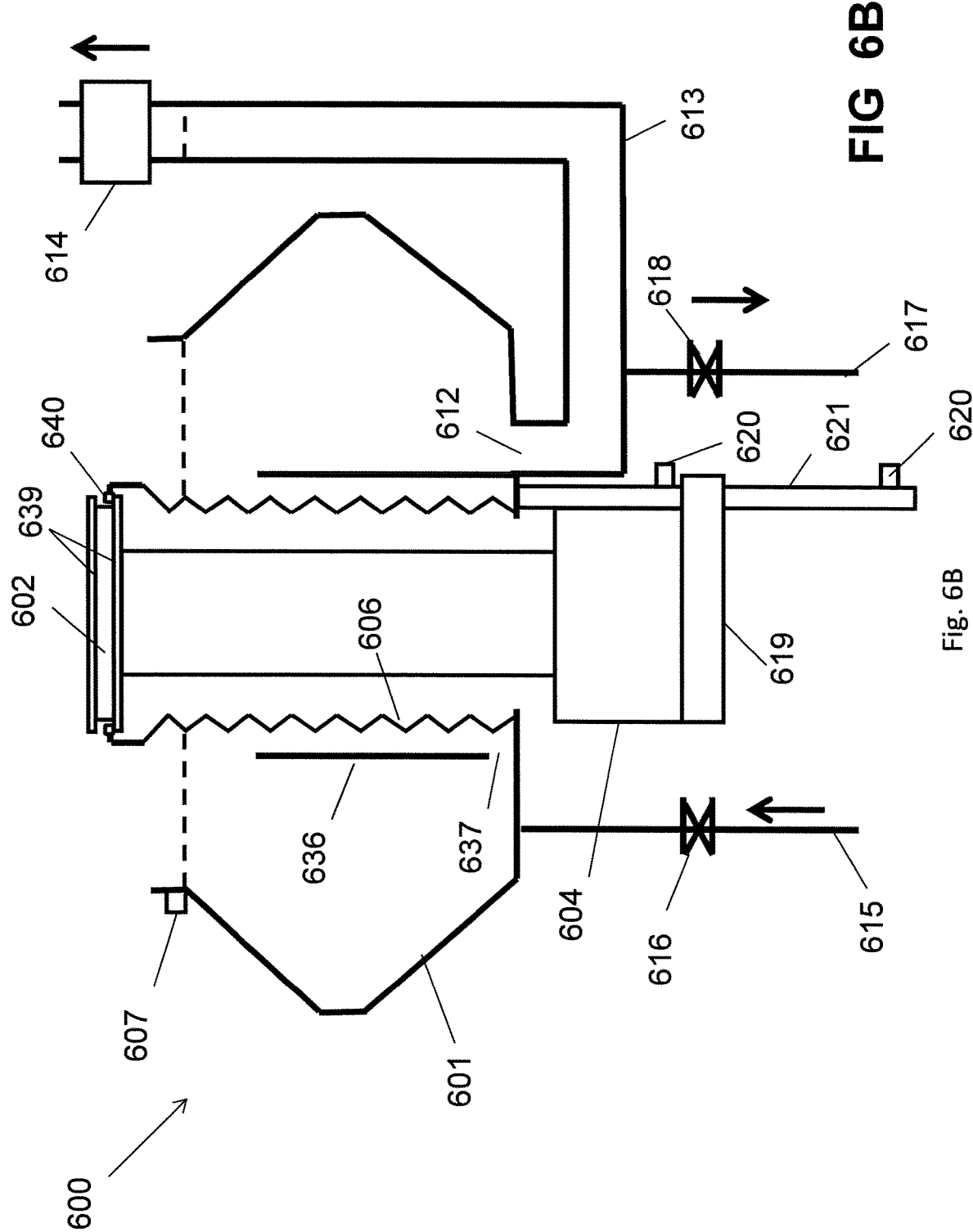

Referring to FIGS. 6A to 6B, FIGS. 6A to 6B are cross-sectional views illustrating a coater with automatic cleaning function according to another exemplary embodiment of the present invention. The coater 600 includes a coater chamber 601. A substrate chuck 602 for holding and positioning a substrate 603 is located in the coater chamber 601. Two magnets 639 are respectively positioned at the top surface of the substrate chuck 602 and the bottom surface of the substrate chuck 602. The polarity of the two magnets' surfaces which are opposite is the same. The substrate chuck 602 is connected to a rotating actuator 604 used for driving the substrate chuck 602 to rotate and a vertical actuator 619 used for driving the substrate chuck 602 to move up or move down. There are two position sensors 620 disposed on a shaft 621 which is vertically fixed at the outer bottom of the coater chamber 601, and one position sensor 620 is located at the top of the shaft 621 and the other position sensor 620 is located at the bottom of the shaft 621. The vertical actuator 619 moves along the shaft 621. For coating photoresist, the vertical actuator 619 moves down along the shaft 621 and stops at a position of the position sensor 620 located at the bottom of the shaft 621. The substrate chuck 602 is received in the coater chamber 601. For coater cleaning, the vertical actuator 619 moves up along the shaft 621 and stops at a position of the other position sensor 620 located at the top of the shaft 621. The substrate chuck 602 is stretched out of the coater chamber 601. An elastic protecting wall 606 is positioned in the coater chamber 601 for preventing the cleaning solution from entering into the rotating actuator 604 and the vertical actuator 619. The bottom end of the elastic protecting wall 606 is connected with the inner bottom of the coater chamber 601. A magnet body 640 is settled at the top end of the elastic protecting wall 606. The magnet body 640 is located between the two magnets 639. The polarity of the both sides of the magnet body 640 is the same as the polarity of the two magnets' surfaces which are opposite. A level sensor 607 is installed on the coater chamber 601 for detecting the level of the cleaning solution in the coater chamber 601. A shielding wall 636 is vertically positioned in the coater chamber 601 and surrounds the elastic protecting wall 606. The top of the shielding wall 636 extends to approach the top surface of the substrate chuck 602 for protecting the substrate chuck 602 from being coated with the photoresist. The bottom of the shielding wall 636 defines a gap 637 for the cleaning solution in the space between the elastic protecting wall 606 and shielding wall 636 draining out. The coater chamber 601 defines an exhaust port 612 for venting gas out of the coater chamber 601. An exhaust pipe 613 is connected to the exhaust port 612. A switch valve 614 is installed on the exhaust pipe 613. When coating the photoresist on the surface of the substrate 603, the switch valve 614 is turned on for venting gas out of the coater chamber 601, and when the coater needs to clean, the switch valve 614 is turned off for filling up the coater chamber 601 with the cleaning solution. In this case, the exhaust pipe 613 is also filled with the cleaning solution. The position height of the switch valve 614 can be higher than the position height of the level sensor 607 or lower than the position height of the level sensor 607. If the position height of the switch valve 614 is higher than the position height of the level sensor 607, the tightness requirement of the switch valve 614 is relatively low. If the position height of the switch valve 614 is lower than the position height of the level sensor 607, the tightness requirement of the switch valve 614 is relatively high, ensuring the cleaning solution cannot flow past the switch valve 614.

A liquid inlet pipe 615 is connected to the coater chamber 601 for supplying the cleaning solution to the coater chamber 601, and a liquid inlet valve 616 is installed on the liquid inlet pipe 615. A liquid outlet pipe 617 is connected to the coater chamber 601 for draining the cleaning solution out of the coater chamber 601. In this embodiment, because the exhaust pipe 613 is filled with the cleaning solution, for fully draining the cleaning solution, preferably, the liquid outlet pipe 617 is positioned at the lowest point of the exhaust pipe 613. A liquid outlet valve 618 is installed on the liquid outlet pipe 617.

As shown in FIG. 6A, when the coater 600 is used for coating the photoresist on the surface of the substrate 603, the switch valve 614 is turned on so that the gas in the coater chamber 601 is vented out of the coater chamber 601 through the exhaust port 612 and the exhaust pipe 613. The vertical actuator 619 drives the substrate chuck 602 to move down until the position sensor 620 located at the bottom of the shaft 621 detects the vertical actuator 619. The substrate chuck 602 is received in the coater chamber 601. The magnet body 640 moves along with the substrate chuck 602. After the substrate chuck 602 stops moving, the magnet body 640 is located between the two magnets 639 and does not contact with the two magnets 639 under the action of magnetic force between the magnet body 640 and the two magnets 639. The rotating actuator 604 drives the substrate chuck 602 to rotate and then the photoresist is sprayed to the surface of the substrate 603. Through a method of spin coating, a uniform layer of photoresist is coated on the surface of the substrate 603.

As shown in FIG. 6B, when the coater 600 needs to clean, the switch valve 614 and the liquid outlet valve 618 are turned off. The vertical actuator 619 drives the substrate chuck 602 to move up until the position sensor 620 located at the top of the shaft 621 detects the vertical actuator 619. The substrate chuck 602 stretches out of the coater chamber 601. In the process of the substrate chuck 602 moving up, the magnet body 640 abuts on the magnet 639 positioned at the bottom surface of the substrate chuck 602 and the magnet body 640 moves up along with the substrate chuck 602. After the substrate chuck 602 moving out of the coater chamber 601, the liquid inlet valve 616 is turned on and the cleaning solution is supplied to the coater chamber 601 through the liquid inlet pipe 615. The coater chamber 601 is filled up with the cleaning solution. After the photoresist in the coater chamber 601 is dissolved into the cleaning solution, the liquid outlet valve 618 is turned on and the cleaning solution in the coater chamber 601 and the exhaust pipe 613 is drained out through the liquid outlet pipe 617. When the substrate 603 is loaded on the substrate chuck 602 or unloaded from the substrate chuck 602, the vertical actuator 619 drives the substrate chuck 602 to stretch out of the coater chamber 601.

Figure 7A:
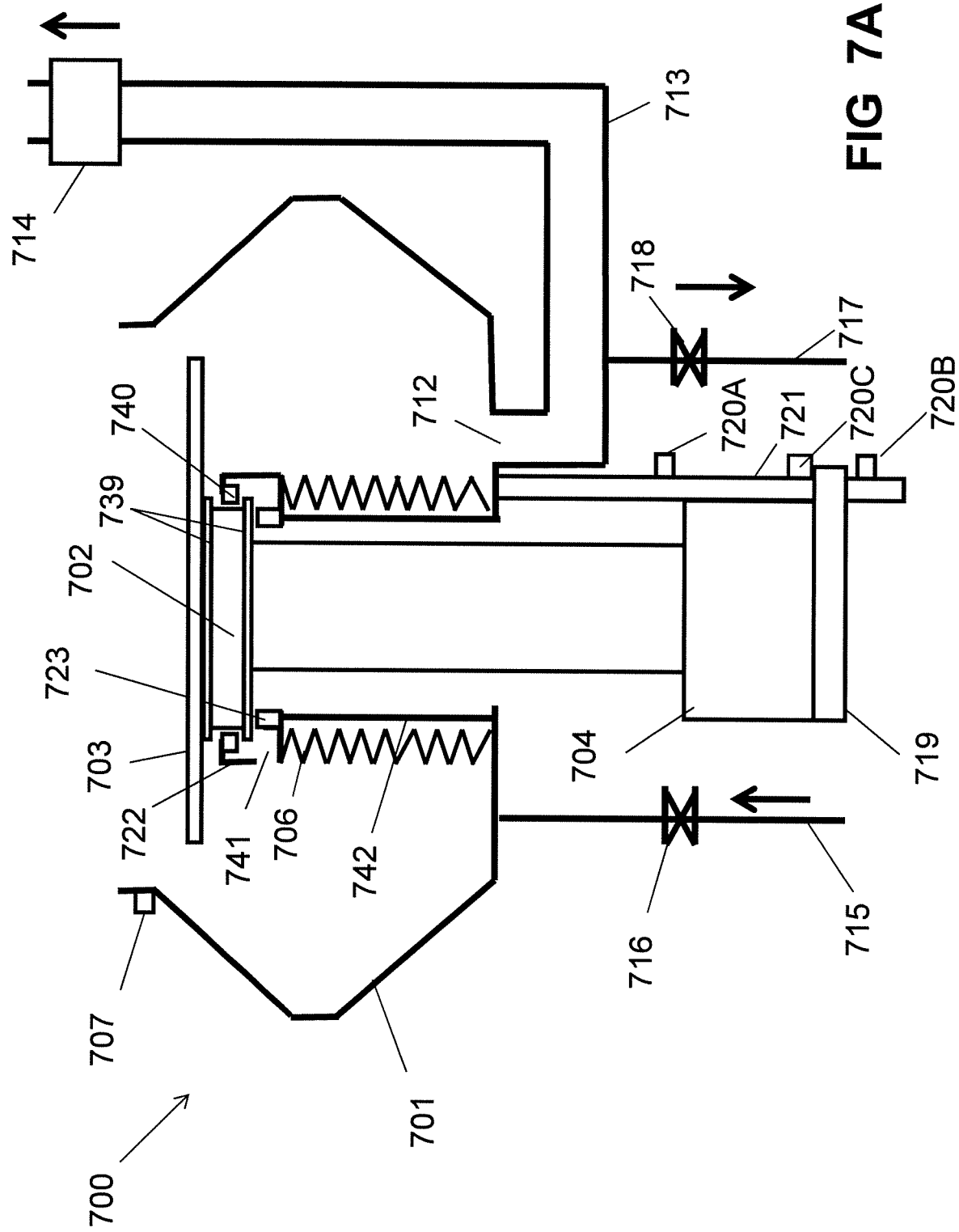
FIGS. 7A to 7C are cross-sectional views illustrating a coater with automatic cleaning function according to another exemplary embodiment of the present invention.
Figure 7B:
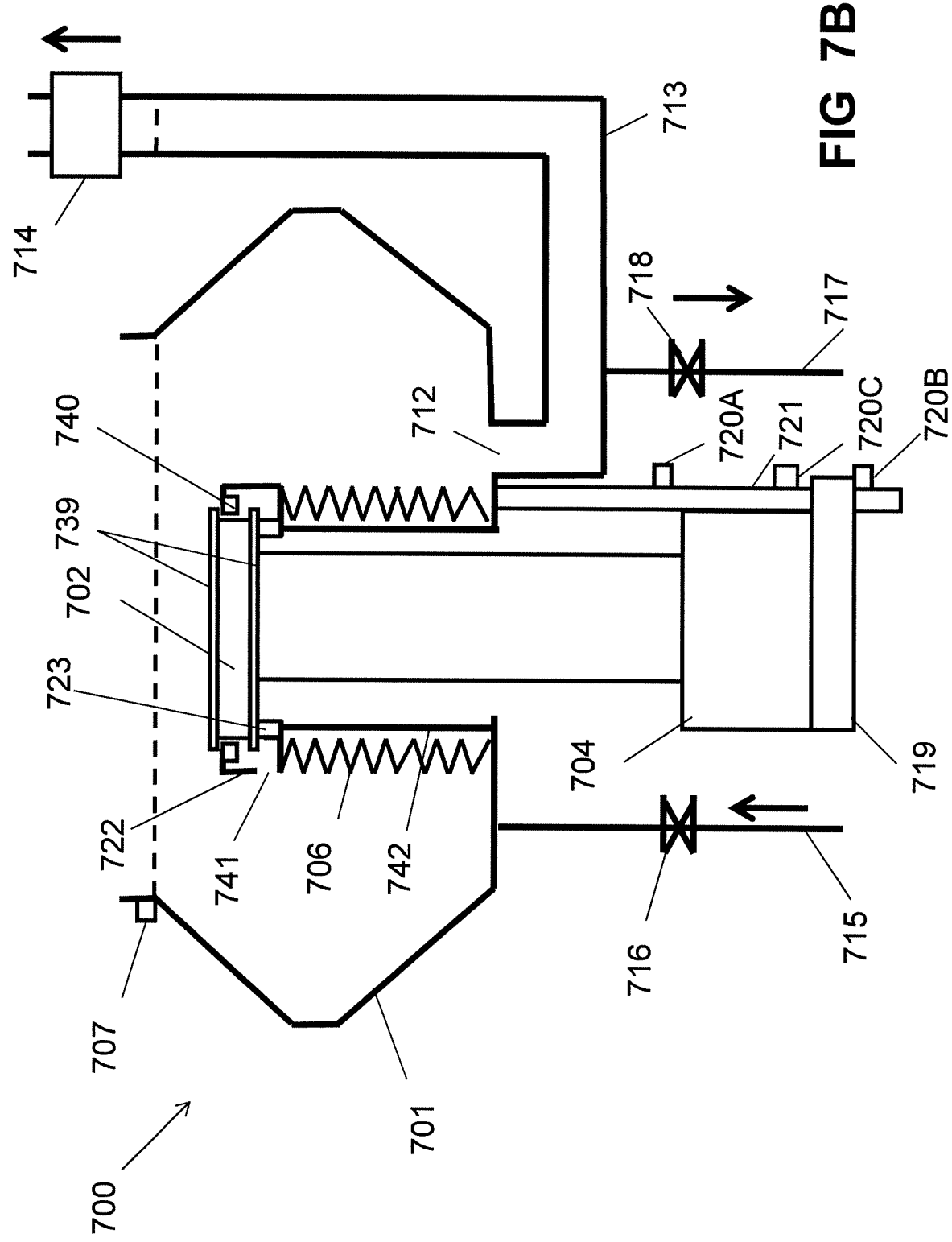
Figure 7C:
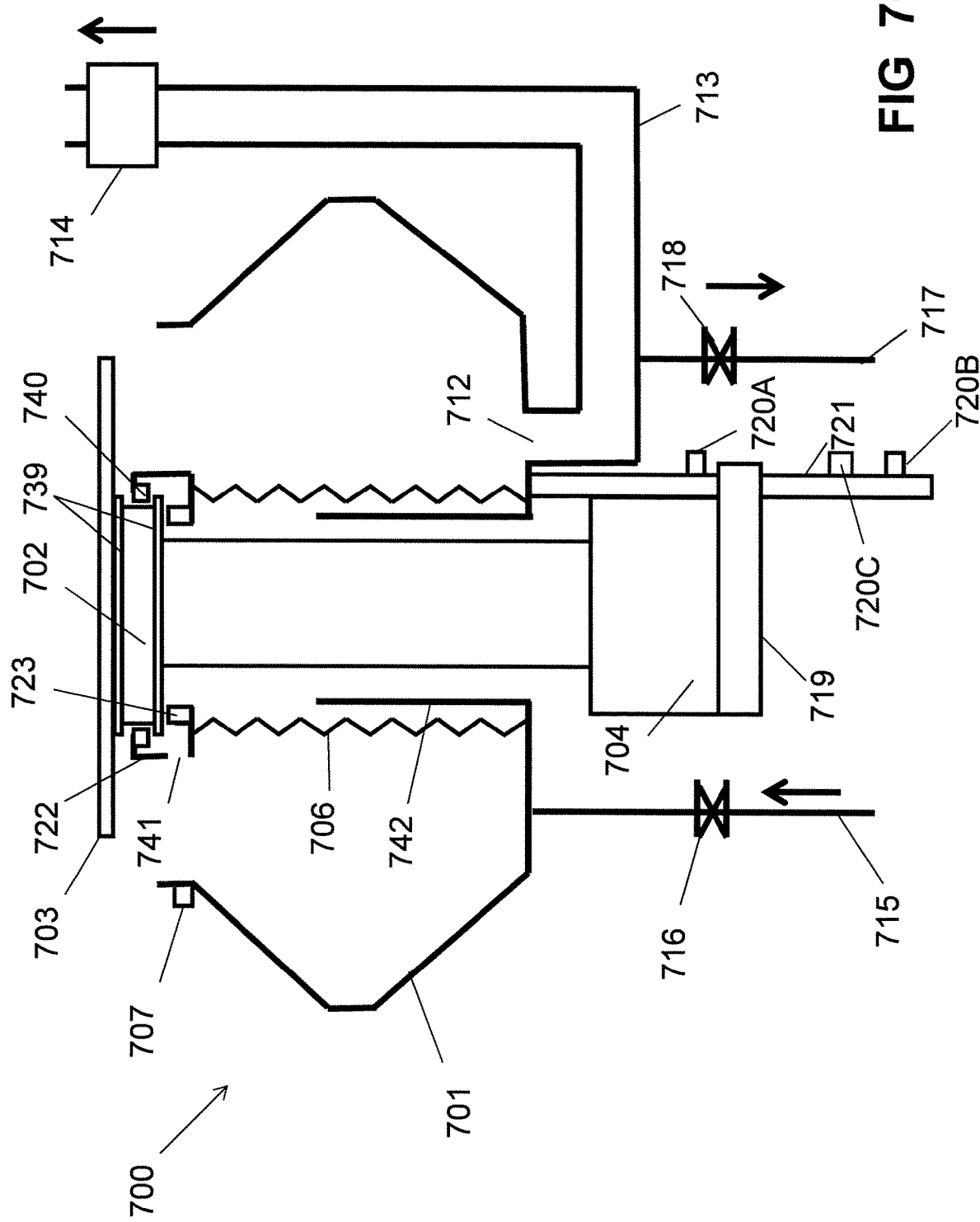

Referring to FIGS. 7A to 7C, FIGS. 7A to 7C are cross-sectional views illustrating a coater with automatic cleaning function according to another exemplary embodiment of the present invention. The coater 700 includes a coater chamber 701. A substrate chuck 702 for holding and positioning a substrate 703 is located in the coater chamber 701. Two magnets 739 are respectively positioned at the top surface of the substrate chuck 702 and the bottom surface of the substrate chuck 702. The polarity of the two magnets' surfaces which are opposite is the same. The substrate chuck 702 is connected to a rotating actuator 704 used for driving the substrate chuck 702 to rotate and a vertical actuator 719 used for driving the substrate chuck 702 to move up or move down. There are three position sensors disposed on a shaft 721 which is vertically fixed at the outer bottom of the coater chamber 701. One position sensor 720A is located at the top of the shaft 721. One position sensor 720B is located at the bottom of the shaft 721. One position sensor 720C is located between the position sensor 720A and the position sensor 720B. The vertical actuator 719 moves along the shaft 721. For coating photoresist, the vertical actuator 719 moves up along the shaft 721 and stops at a position of the position sensor 720C. For coater cleaning, the vertical actuator 219 moves down along the shaft 221 and stops at a position of the position sensor 720B located at the bottom of the shaft 221. For loading or unloading the substrate 703, the vertical actuator 719 moves up along the shaft 721 and stops at a position of the position sensor 720A. An elastic protecting wall 706 is positioned in the coater chamber 701. The elastic protecting wall 706 can be a bellows. For preventing the cleaning solution from entering into the rotating actuator 704 and the vertical actuator 719, one end of the elastic protecting wall 706 is connected with the inner bottom of the coater chamber 701 and the other end of the elastic protecting wall 706 is connected with a sealing member 722. The sealing member 722 has a sealing ring 723 settled on the bottom of the sealing member 722 and a magnet body 740 settled at the top of the sealing member 722. The magnet body 740 is located between the two magnets 739. The polarity of the both sides of the magnet body 740 is the same as the polarity of the two magnets' surfaces which are opposite. A drain opening 741 is defined at the bottom of the sealing member 722. A bearing wall 742 is positioned in the coater chamber 701 and is surrounded by the elastic protecting wall 706. A level sensor 707 is installed on the coater chamber 701 for detecting the level of the cleaning solution in the coater chamber 701. The coater chamber 701 defines an exhaust port 712 for venting gas out of the coater chamber 701. An exhaust pipe 713 is connected to the exhaust port 712. A switch valve 714 is installed on the exhaust pipe 713. When coating the photoresist on the surface of the substrate 703, the switch valve 714 is turned on for venting gas out of the coater chamber 701, and when the coater needs to clean, the switch valve 714 is turned off for filling up the coater chamber 701 with the cleaning solution. In this case, the exhaust pipe 713 is also filled with the cleaning solution. A liquid inlet pipe 715 is connected to the coater chamber 701 for supplying the cleaning solution to the coater chamber 701, and a liquid inlet valve 716 is installed on the liquid inlet pipe 715. A liquid outlet pipe 717 is connected to the coater chamber 701 for draining the cleaning solution out of the coater chamber 701. In this embodiment, because the exhaust pipe 713 is filled with the cleaning solution, for fully draining the cleaning solution, preferably, the liquid outlet pipe 717 is positioned at the lowest point of the exhaust pipe 713. A liquid outlet valve 718 is installed on the liquid outlet pipe 717.

As shown in FIG. 7A, when the coater 700 is used for coating the photoresist on the surface of the substrate 703, the switch valve 714 is turned on so that the gas in the coater chamber 701 is vented out of the coater chamber 701 through the exhaust port 712 and the exhaust pipe 713. The vertical actuator 719 drives the substrate chuck 702 to move up until the position sensor 720C detects the vertical actuator 719. The substrate chuck 702 is received in the coater chamber 701. The magnet body 740 is located between the two magnets 739 and does not contact with the two magnets 739 under the action of magnetic force between the magnet body 740 and the two magnets 739. The substrate chuck 702 either does not contact with the sealing ring 723. The rotating actuator 704 drives the substrate chuck 702 to rotate and then the photoresist is sprayed to the surface of the substrate 703. Through a method of spin coating, a uniform layer of photoresist is coated on the surface of the substrate 703.

As shown in FIG. 7B, when the coater 700 needs to clean, the switch valve 714 and the liquid outlet valve 718 are turned off. The vertical actuator 719 drives the substrate chuck 702 to move down until the position sensor 720B detects the vertical actuator 719. The elastic protecting wall 706 is compressed downward and the bearing wall 742 holds up the sealing member 722. The bottom of the substrate chuck 702 is pressed against the sealing ring 723 for preventing the cleaning solution from entering into the vertical actuator 719 and the rotating actuator 704. The liquid inlet valve 716 is turned on and the cleaning solution is supplied to the coater chamber 701 through the liquid inlet pipe 715. The coater chamber 701 is filled up with the cleaning solution. The substrate chuck 702, the sealing member 722 and the elastic protecting wall 706 are immersed into the cleaning solution for cleaning. After the photoresist in the coater chamber 701 is dissolved into the cleaning solution, the liquid outlet valve 718 is turned on and the cleaning solution in the coater chamber 701 and the exhaust pipe 713 is drained out through the liquid outlet pipe 717. The cleaning solution in the sealing member 722 is drained from the drain opening 741.

As shown in FIG. 7C, for loading the substrate 703 on the substrate chuck 702 or unloading the substrate 703 from the substrate chuck 702, the vertical actuator 719 drives the substrate chuck 702 to move up until the position sensor 720A detects the vertical actuator 719. The substrate chuck 702 stretches out of the coater chamber 701.

Figure 8:
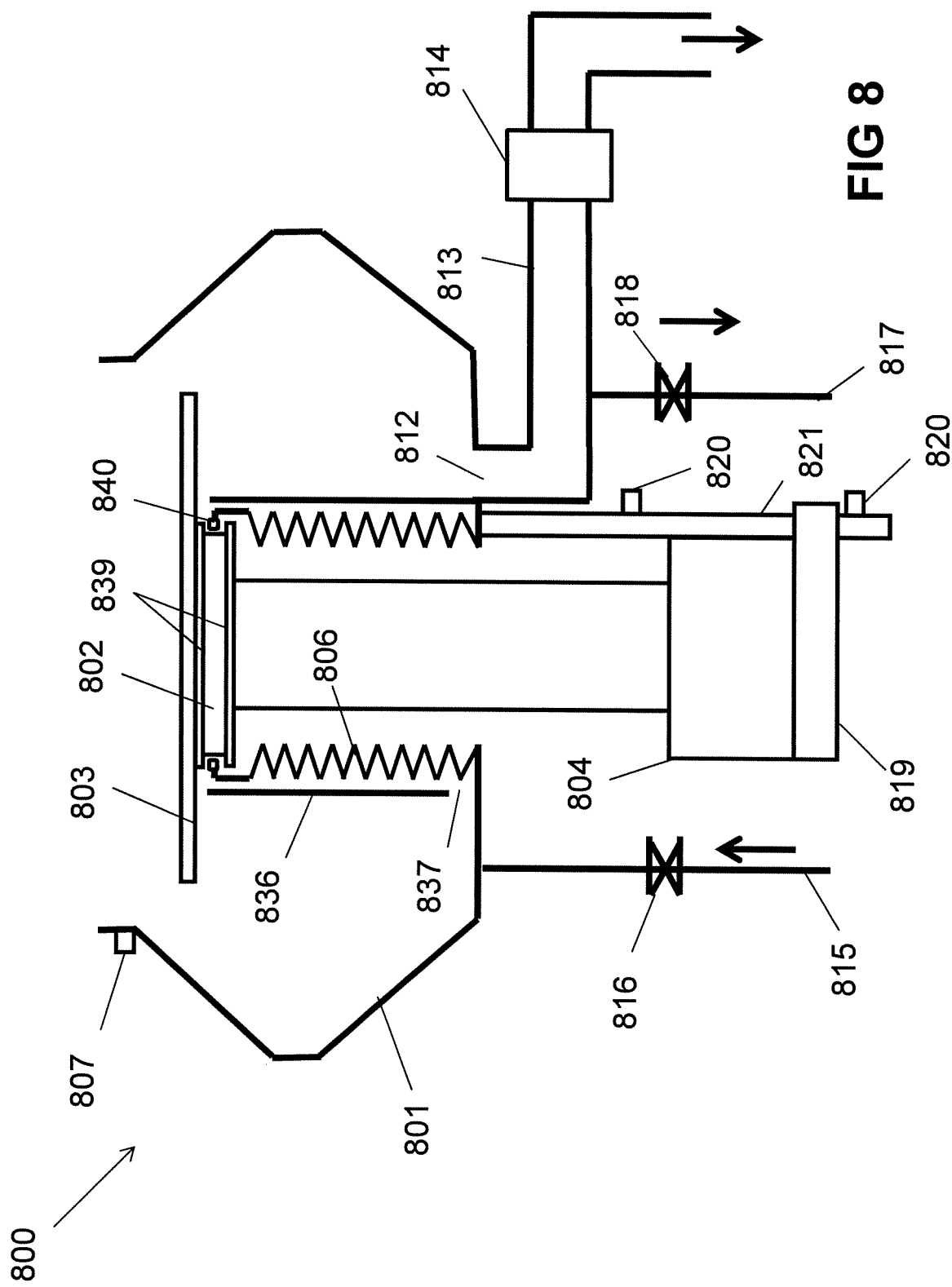
FIG. 8 is a cross-sectional view illustrating a coater with automatic cleaning function according to another exemplary embodiment of the present invention.

Referring to FIG. 8, FIG. 8 is a cross-sectional view illustrating a coater with automatic cleaning function according to another exemplary embodiment of the present invention. Comparing to the coater 600, the difference is that the position height of the switch valve 814 is lower than the position height of the level sensor 807. In this condition the tightness requirement of the switch valve 814 is relatively high, ensuring the cleaning solution cannot flow past the switch valve 814.

According to the present invention, a coater automatic cleaning method comprises the following steps:
turning off a liquid outlet valve of the coater;
filling up a coater chamber with cleaning solution;
after photoresist in the coater chamber being dissolved into the cleaning solution, turning on the liquid outlet valve and draining the cleaning solution out of the coater chamber.

The method further comprises turning off a switch valve which is installed on an exhaust pipe connecting with an exhaust port of the coater before filling up the coater chamber with the cleaning solution.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

The invention claimed is:

1. A coater with an automatic cleaning function, further comprising:
   a coater chamber capable of being filled with a cleaning solution;
   a substrate chuck holding and positioning a substrate;
   a vertical actuator connecting with the substrate chuck for driving the substrate chuck to move up or move down;
   two magnets respectively positioned at a top surface of the substrate chuck and a bottom surface of the substrate chuck, the two magnets having opposing surfaces with the same polarity,
   an elastic protecting wall positioned in the coater chamber, the elastic protecting wall having a bottom end connected with an inner bottom of the coater chamber, and
   a magnet body positioned at a top end of the elastic protecting wall, the magnet body located between the two magnets, the magnet body having opposite sides with the same polarity as the opposing surfaces of the two magnets.

2. The coater as claimed in claim 1, wherein for coating a photoresist, the vertical actuator drives the substrate chuck to move down, the substrate chuck is received in the coater chamber, the magnet body moves along with the substrate chuck, and, after the substrate chuck stops moving, the magnet body is located between the two magnets and does not come into physical contact with the two magnets under the action of magnetic force between the magnet body and the two magnets.

3. The coater as claimed in claim 1, wherein for coater cleaning, the vertical actuator drives the substrate chuck to move up and stretch out of the coater chamber, the magnet body abuts on the magnet positioned at the bottom surface of the substrate chuck, and the magnet body moves up along with the substrate chuck.

4. The coater as claimed in claim 1, further comprising a shielding wall positioned in the coater chamber and surrounding the elastic protecting wall, a top of the shielding wall extending to approach the top surface of the substrate chuck when coating the photoresist.

5. The coater as claimed in claim 4, wherein a bottom of the shielding wall defines a gap for the cleaning solution in the space between the protecting wall and the shielding wall draining out.

6. A coater with an automatic cleaning function, comprising:
   a coater chamber capable of being filled with a cleaning solution;
   a substrate chuck holding and positioning a substrate;
   a vertical actuator connecting with the substrate chuck for driving the substrate chuck to move up or move down;
   two magnets respectively positioned at a top surface of the substrate chuck and a bottom surface of the substrate chuck, the two magnets having opposing surfaces with the same polarity,
   a sealing member having a sealing ring positioned on a bottom thereof;
   an elastic protecting wall positioned in the coater chamber, one end of the elastic protecting wall connected with an inner bottom of the coater chamber and the other end of the elastic protecting wall connected with the sealing member, and
   a magnet body positioned at the top of the sealing member, the magnet body located between the two magnets, the magnet body having opposite sides with the same polarity as the opposing surfaces of the two magnets.

7. The coater as claimed in claim 6, further comprising a drain opening defined at the bottom of the sealing member.

8. The coater as claimed in claim 6, further comprising a bearing wall positioned in the coater chamber and surrounded by the elastic protecting wall.

9. The coater as claimed in claim 6, wherein the elastic protecting wall is a bellows.

10. The coater as claimed in claim 6, wherein for coating a photoresist, the vertical actuator drives the substrate chuck to move up, the substrate chuck is received in the coater chamber, the magnet body is located between the two magnets and does not come into contact with the two magnets under the action of magnetic force between the magnet body and the two magnets, and the substrate chuck does not contact the sealing ring.

11. The coater as claimed in claim 6, wherein for coater cleaning, the vertical actuator drives the substrate chuck to move down, the bottom of the substrate chuck is pressed against the sealing ring to form a seal, then the coater chamber is filled up with the cleaning solution and the substrate chuck is immersed into the cleaning solution for cleaning.

* * * * *